(12) United States Patent
Tawarazako et al.

(10) Patent No.: US 10,844,259 B2
(45) Date of Patent: Nov. 24, 2020

(54) SILICA-BASED COMPOSITE FINE PARTICLE DISPERSION AND METHOD FOR MANUFACTURING SAME

(71) Applicant: JGC Catalysts and Chemicals Ltd., Kawasaki-shi (JP)

(72) Inventors: Yuji Tawarazako, Kitakyushu (JP); Michio Komatsu, Kitakyushu (JP); Kazuhiro Nakayama, Kitakyushu (JP); Yukihiro Iwasaki, Kitakyushu (JP); Yoshinori Wakamiya, Kitakyushu (JP); Shota Kawakami, Kitakyushu (JP); Shinya Usuda, Kitakyushu (JP)

(73) Assignee: JGC Catalysts and Chemicals Ltd., Kawasaki (JP)

( * ) Notice: Subject to any disclaimer, the term of this patent is extended or adjusted under 35 U.S.C. 154(b) by 0 days.

(21) Appl. No.: 16/094,969

(22) PCT Filed: Apr. 5, 2017

(86) PCT No.: PCT/JP2017/014187
§ 371 (c)(1),
(2) Date: Oct. 19, 2018

(87) PCT Pub. No.: WO2017/183452
PCT Pub. Date: Oct. 26, 2017

(65) Prior Publication Data
US 2019/0153279 A1    May 23, 2019

(30) Foreign Application Priority Data

Apr. 22, 2016  (JP) ................. 2016-086610
Apr. 22, 2016  (JP) ................. 2016-086612
(Continued)

(51) Int. Cl.
*C09K 3/14* (2006.01)
*C01B 33/18* (2006.01)
(Continued)

(52) U.S. Cl.
CPC .............. *C09K 3/1436* (2013.01); *B24B 1/00* (2013.01); *B24B 37/00* (2013.01); *B24B 37/044* (2013.01);
(Continued)

(58) Field of Classification Search
None
See application file for complete search history.

(56) References Cited

U.S. PATENT DOCUMENTS 5,766,279 A  6/1998 Ueda et al.
5,938,837 A  8/1999 Hanawa et al.
(Continued)

FOREIGN PATENT DOCUMENTS

JP    9-132770 A    5/1997
JP    2746861 B2    5/1998
(Continued)

OTHER PUBLICATIONS

Zhao, Xiaobing et al., Synthesis, characterization of CeO2@SiO2 nanoparticles and their oxide CMP behavior, Microelectronic Engineering, 2010, p. 1716-1720, vol. 87.
(Continued)

*Primary Examiner* — Jiong-Ping Lu
(74) *Attorney, Agent, or Firm* — The Webb Law Firm

(57) ABSTRACT

Disclosed is a silica-based composite fine particle dispersion including a silica-based composite fine particle which comprises a mother particle containing amorphous silica as a main component with a child particle containing crystalline ceria as a main component on a surface thereof. Features of the silica-based composite fine particle include a silica to
(Continued)

ceria mass ratio of 100:11 to 316, and when subjected to X-ray diffraction, only the crystalline phase of ceria is detected, and when subjected to X-ray diffraction for measurement, the crystalline ceria has a crystallite diameter of 10 to 25 nm.

17 Claims, 6 Drawing Sheets

(30) Foreign Application Priority Data

Apr. 22, 2016 (JP) .................................. 2016-086613
Apr. 22, 2016 (JP) .................................. 2016-086614

(51) Int. Cl.

| | | |
|---|---|---|
| H01L 21/304 | (2006.01) | |
| B24B 37/00 | (2012.01) | |
| C01B 33/149 | (2006.01) | |
| C09G 1/00 | (2006.01) | |
| C09G 1/04 | (2006.01) | |
| C09G 1/06 | (2006.01) | |
| C09K 13/06 | (2006.01) | |
| B24B 1/00 | (2006.01) | |
| B24B 37/04 | (2012.01) | |
| C09G 1/02 | (2006.01) | |
| H01L 21/306 | (2006.01) | |
| H01L 21/3105 | (2006.01) | |

(52) U.S. Cl.
CPC ............ *C01B 33/149* (2013.01); *C01B 33/18* (2013.01); *C09G 1/00* (2013.01); *C09G 1/02* (2013.01); *C09G 1/04* (2013.01); *C09G 1/06* (2013.01); *C09K 3/14* (2013.01); *C09K 13/06* (2013.01); *H01L 21/304* (2013.01); *H01L 21/30625* (2013.01); *H01L 21/31053* (2013.01)

(56) References Cited

U.S. PATENT DOCUMENTS

| | | | |
|---|---|---|---|
| 2003/0118824 | A1 | 6/2003 | Tokarz et al. |
| 2005/0279733 | A1* | 12/2005 | Carter ..................... C09G 1/02 |
| | | | 216/88 |
| 2010/0167547 | A1 | 7/2010 | Kamimura |
| 2012/0077419 | A1 | 3/2012 | Zhang et al. |
| 2012/0299158 | A1* | 11/2012 | Shinoda .................. C09G 1/02 |
| | | | 257/618 |
| 2017/0283673 | A1 | 10/2017 | Zhou et al. |
| 2018/0105428 | A1 | 4/2018 | Tawarazako et al. |

FOREIGN PATENT DOCUMENTS

| | | | | |
|---|---|---|---|---|
| JP | 2003-509855 | A | 3/2003 | |
| JP | 2007061989 | A | 3/2007 | |
| JP | 2008227098 | A | 9/2008 | |
| JP | 2009078936 | A | 4/2009 | |
| JP | 2009212378 | A | 9/2009 | |
| JP | 2013119131 | A | 6/2013 | |
| JP | 2015063451 | A | 4/2015 | |
| JP | 2015199652 | A | 11/2015 | |
| JP | 2015201237 | A | 11/2015 | |
| JP | 2015231029 | | * 12/2015 | ............ B24B 37/00 |
| JP | 2015231029 | A | 12/2015 | |
| JP | 2017001927 | A | 1/2017 | |
| JP | 2017-190450 | A | 10/2019 | |
| WO | 01/19935 | A1 | 3/2001 | |
| WO | 2005/035688 | A1 | 4/2005 | |
| WO | WO2005035688 | | * 4/2005 | ............... C09K 3/14 |
| WO | 2016/159167 | A1 | 10/2016 | |
| WO | 2016159167 | A1 | 10/2016 | |

OTHER PUBLICATIONS

Lee, Seung-Ho, et al., Chemical mechanical polishing of thermal oxide films using silica particles coated with ceria, J. Mater Res., Oct. 2002, pp. 2744-2749, vol. 17, No. 10, Materials Research Society.

* cited by examiner

SILICA-BASED COMPOSITE FINE PARTICLE DISPERSION AND METHOD FOR MANUFACTURING SAME

TECHNICAL FIELD

The present invention relates to a silica-based composite fine particle dispersion suitable as an abrasive for use in manufacturing semiconductor devices. The present invention more specifically relates to a silica-based composite fine particle dispersion for flattening a film formed on a substrate to be polished by means of chemical mechanical polishing (CMP), a method of manufacturing the same, and a polishing abrasive grain dispersion containing silica-based composite fine particles.

BACKGROUND ART

Semiconductor devices such as a semiconductor substrate and a circuit board realize high performance by achieving a higher density and finer design. So-called chemical mechanical polishing (CMP) is applied to the semiconductor manufacturing step, and is more specifically an essential technique for shallow trench isolation, flattening of an interlayer dielectric film, and formation of contact plugs and Cu damascene interconnects.

In general, an abrasive for CMP includes abrasive grains and chemical components, and the chemical components have a role in promoting polishing through oxidation or corrosion of a coating to be polished. On the other hand, the abrasive grains have a role in polishing through a mechanical action, and colloidal silica, fumed silica, and ceria particles are used as the abrasive grains. In particular, ceria particles show a specifically high polishing rate with respect to a silicon oxide film and are therefore applied to polish in a shallow trench isolation step.

Not only polishing of a silicon oxide film but also polishing of a silicon nitride film is performed in the shallow trench isolation step. In order to facilitate isolation, it is desirable to have a high polishing rate for a silicon oxide film and a low polishing rate for a silicon nitride film, and the ratio between the polishing rates (selected ratio) is also important.

A method of obtaining a smooth surface or an extremely highly accurate surface having few scratches or flaws has conventionally been performed as such a member polishing method by performing a comparatively coarse primary polishing process followed by a fine secondary polishing process.

For instance, methods to be described below have conventionally been proposed for the abrasive used in secondary polishing as such finish polishing.

For instance, Patent Literature 1 describes a method of manufacturing cerium oxide ultrafine particles (average particle size: 10 to 80 nm) which are formed of cerium oxide single crystal grains, comprising the steps of mixing, with stirring, an aqueous solution of cerous nitrate with a base at such a mixing ratio that the pH value of the mixture ranges from 5 to 10, then rapidly heating the resulting mixture up to a temperature of 70 to 100° C., and aging the mixture at that temperature. Patent Literature 1 further describes that this preparation method can provide cerium oxide ultrafine particles which are highly uniform in particle size and particle shape.

Non-Patent Literature 1 discloses a method of manufacturing ceria-coated silica including manufacturing steps which are similar to those of the method of manufacturing cerium oxide ultrafine particles as described in Patent Literature 1. The method of manufacturing ceria-coated silica does not have a burning-dispersion step which is included in the manufacturing method described in Patent Literature 1.

Further, Patent Literature 2 describes silica-based composite particles comprising, on surfaces of amorphous silica particles A, a crystalline oxide layer B containing one or more elements selected from zirconium, titanium, iron, manganese, zinc, cerium, yttrium, calcium, magnesium, fluorine, lanthanum, and strontium. Patent Literature 2 also describes, as a preferred embodiment, silica-based composite particles comprising amorphous silica particles A; an amorphous oxide layer C which is formed on surfaces of the amorphous silica particles A, contain elements such as aluminum, and is different from an amorphous silica layer; and a crystalline oxide layer B which is formed on the amorphous oxide layer C and contains one or more elements selected from zirconium, titanium, iron, manganese, zinc, cerium, yttrium, calcium, magnesium, fluorine, lanthanum, and strontium. Patent Literature 2 also describes that the silica-based composite particles described above have the crystalline oxide layer B on the surfaces of the amorphous silica particles A to enable improvement of the polishing rate, the silica particles are pre-treated to suppress sintering between the particles during burning, thereby enabling improvement of the dispersibility in a polishing slurry, and further non-use of cerium oxide or considerable reduction of the amount of cerium oxide used can be achieved to thereby provide an inexpensive abrasive having high polishing performance. Patent Literature 2 also describes that the silica-based composite particles further having the amorphous oxide layer C between the silica-based particles A and the oxide layer B are particularly effective in suppressing particle sintering and in improving the polishing rate.

CITATION LIST

Patent Literature

Patent Literature 1: JP 2746861 B
Patent Literature 2: JP 2013-119131 A

Non-Patent Literature

Non-Patent Literature 1: Seung-Ho Lee, Zhenyu Lu, S. V. Babu and Egon Matijevic, "Chemical mechanical polishing of thermal oxide films using silica particles coated with ceria", Journal of Materials Research, Volume 17, Issue 10, 2002, pp 2744-2749

SUMMARY OF INVENTION

Technical Problems

However, the inventors of the present invention have actually prepared and examined the cerium oxide ultrafine particles described in Patent Literature 1 and found that the polishing rate is low and a polished substrate surface is further more likely to cause defects (deteriorated surface accuracy, increased scratches, and an abrasive remaining on a polished substrate surface).

The inventors of the present invention assume that this is mainly because, as compared to a method of manufacturing ceria particles including a burning step (burning increases the degree of crystallinity of ceria particles), the method of manufacturing cerium oxide ultrafine particles as described in Patent Literature 1 does not include a burning step but only crystallizes cerium oxide particles with a liquid phase (aqueous solution containing cerous nitrate) and produced cerium oxide particles have therefore a low degree of crystallinity, and cerium oxide does not firmly adhere to mother particles for lack of burning treatment and comes off to remain on a polished substrate surface.

Further, the ceria-coated silica described in Non-Patent Literature 1 is not burned and the actual polishing rate is therefore deemed to be low because of a low degree of crystallinity of ceria. There is also a concern about particles that may come off to remain on a polished substrate surface.

The inventors of the present invention further found that polishing with the use of the silica-based composite particles in the embodiment including the oxide layer C as described in Patent Literature 2 may cause impurities such as aluminum to remain on surfaces of a semiconductor device to adversely affect the semiconductor device.

The present invention has been made to solve the problems as described above. More specifically, the present invention aims at providing a silica-based composite fine particle dispersion capable of polishing at a high rate a silica film, an Si wafer, and even a hard-to-work material, simultaneously achieving a high degree of surface accuracy (a small number of scratches, a small number of residual abrasive grains on a substrate, improved substrate Ra value and the like), and being preferably used in polishing surfaces of semiconductor devices such as a semiconductor substrate and a circuit board, a method of manufacturing the same, and a polishing abrasive grain dispersion containing silica-based composite fine particles.

Solution to Problems

The inventors of the present invention have made an intensive study to solve the problems described above and completed the present invention.

The present invention provides the following (1) and (21).
(1) A silica-based composite fine particle dispersion, child particles primarily composed of crystalline ceria being formed on surfaces of mother particles primarily composed of amorphous silica, the silica-based composite fine particle dispersion comprising silica-based composite fine particles having an average particle size of 50 to 350 nm and having characteristic features of [1] to [3]:
[1] the silica-based composite fine particles have a mass ratio between silica and ceria of 100:11 to 316;
[2] a ceria crystal phase is only detected when the silica-based composite fine particles are subjected to X-ray diffractometry; and
[3] a crystallite size in the crystalline ceria, as measured by subjecting the silica-based composite fine particles to X-ray diffractometry, is 10 to 25 nm.
(2) The silica-based composite fine particle dispersion according to (1) above having a characteristic feature of [4]:
[4] in the silica-based composite fine particles, a percentage of a number of particles having a ratio between a shorter diameter and a longer diameter, as measured by an image analysis method, of not more than 0.8 is not more than 35%.
(3) The silica-based composite fine particle dispersion according to (1) or (2) above having a characteristic feature of [5]:
[5] each of the silica-based composite fine particles has a silica coating formed on surfaces of the child particles.
(4) The silica-based composite fine particle dispersion according to any one of (1) to (3) above having a characteristic feature of [6]:

[6] silicon atoms enter into solid solution in the crystalline ceria as a main component of the child particles.
(5) The silica-based composite fine particle dispersion according to (4) above, wherein as for cerium atoms and silicon atoms included in the child particles, a relationship of $R_1 < R_2$ (where $R_1$ is a distance between adjacent cerium and silicon atoms, and $R_2$ is a distance between adjacent cerium atoms) is satisfied.
(6) The silica-based composite fine particle dispersion according to any one of (3) to (5) above, wherein a ratio of a percentage of a number of Si atoms to a percentage of a number of Ce atoms (Si atom %/Ce atom %) as measured by EDS measurement is not less than 0.9, the EDS measurement being performed by selectively applying electron beams to a portion of the silica coating of the silica-based composite fine particles that can be observed using a transmission electron microscope.
(7) The silica-based composite fine particle dispersion according to any one of (1) to (6) above, wherein impurities are contained in the silica-based composite fine particles in amounts shown in (a) and (b):
(a) Na, Ag, Al, Ca, Cr, Cu, Fe, K, Mg, Ni, Ti, Zn, and Zr are contained in amounts of not more than 100 ppm, respectively; and
(b) U, Th, Cl, $NO_3$, $SO_4$, and F are contained in amounts of not more than 5 ppm, respectively.
(8) The silica-based composite fine particle dispersion according to any one of (1) to (7) above, wherein a streaming potential before titration is a negative potential at a pH value ranging from 3 to 8.
(9) The silica-based composite fine particle dispersion according to any one of (1) to (8) above, wherein when cation colloidal titration is performed, a streaming potential curve in which a ratio (ΔPCD/V) between an amount of streaming potential change (ΔPCD) and an amount of cation colloidal titrant added at a knick (V) as expressed by formula (1) is in a range of −110.0 to −15.0 is obtained:

$$\Delta PCD/V = (I - C)/V \qquad \text{formula (1)}$$

C: streaming potential (mV) at the knick
I: streaming potential (mV) at a starting point of the streaming potential curve; and
V: amount of the cation colloidal titrant added at the knick (mL).
(10) A polishing abrasive grain dispersion comprising the silica-based composite fine particle dispersion according to any one of (1) to (9) above.
(11) The polishing abrasive grain dispersion according to (10) above, wherein the polishing abrasive grain dispersion is used for flattening a semiconductor substrate having a silica film formed thereon.
(12) A method of manufacturing a silica-based composite fine particle dispersion comprising Steps 1 to 3:
Step 1: a step which comprises stirring a silica fine particle dispersion containing silica fine particles dispersed in a solvent; and continuously or discontinuously adding a metal salt of cerium while keeping a temperature at 5 to 98° C. and a pH at 7.0 to 9.0, respectively, thereby obtaining a precursor particle dispersion containing precursor particles;
Step 2: a step which comprises drying the precursor particle dispersion; burning the dried precursor particle dispersion at 400 to 1,200° C. to obtain a burned body; and subjecting the burned body to treatment of (i) or (ii) to obtain a dispersion including a burned and ground body:
(i) dry grinding followed by a solvent dispersion treatment by addition of a solvent; and
(ii) addition of a solvent followed by wet grinding; and Step 3: a step which comprises subjecting the dispersion including the burned and ground body to centrifugation at a relative centrifugal acceleration of not less than 300 G; and subsequently removing precipitated components to obtain the silica-based composite fine particle dispersion.

(13) The method of manufacturing the silica-based composite fine particle dispersion according to (12) above, wherein (ii) in Step 2 includes adding the solvent and performing the wet grinding at a pH ranging from 8.6 to 10.8.

(14) The method of manufacturing the silica-based composite fine particle dispersion according to (13) above, wherein impurities are contained in the silica fine particles in amounts shown in (a) and (b):
(a) Na, Ag, Al, Ca, Cr, Cu, Fe, K, Mg, Ni, Ti, Zn, and Zr are contained in amounts of not more than 100 ppm, respectively; and
(b) U, Th, Cl, $NO_3$, $SO_4$, and F are contained in amounts of not more than 5 ppm, respectively.

(15) The polishing abrasive grain dispersion comprising the silica-based composite fine particles according to any one of (1) to (9) above and having an ionic strength of not less than 0.007.

(16) The polishing abrasive grain dispersion according to (15) above comprising one or two ionic strength adjusters selected from the group consisting of ammonium nitrate and ammonium acetate.

(17) The polishing abrasive grain dispersion comprising the silica-based composite fine particles according to any one of (1) to (9) above and further comprising an acidic compound having an acid dissociation constant (pKa) of not less than 1.5.

(18) The polishing abrasive grain dispersion according to (17) above, wherein the acidic compound is contained in an amount of 0.0002 to 0.1 mass %.

(19) The polishing abrasive grain dispersion according to (17) or (18) above, wherein the acidic compound is acetic acid.

(20) The polishing abrasive grain dispersion according to any one of (15) to (19) above, wherein the polishing abrasive grain dispersion is used for flattening a semiconductor substrate having a silica film formed thereon.

(21) The polishing abrasive grain dispersion according to (20) above, wherein the polishing abrasive grain dispersion has a pH of 3 to 8 and is used for flattening the semiconductor substrate having the silica film formed thereon.

Advantageous Effects of Invention

The present invention can provide a silica-based composite fine particle dispersion capable of polishing at a high rate a silica film, an Si wafer, and even a hard-to-work material, simultaneously achieving a high degree of surface accuracy (a small number of scratches, low surface roughness (Ra) of a polished substrate and the like), and being preferably used in polishing surfaces of semiconductor devices such as a semiconductor substrate and a circuit board, a method of manufacturing the same, and a polishing abrasive grain dispersion containing silica-based composite fine particles.

The silica-based composite fine particle dispersion of the invention is effective in flattening semiconductor device surfaces and is particularly suitable for polishing a substrate having a silica insulating film formed thereon.

DESCRIPTION OF EMBODIMENTS

Figure 1:
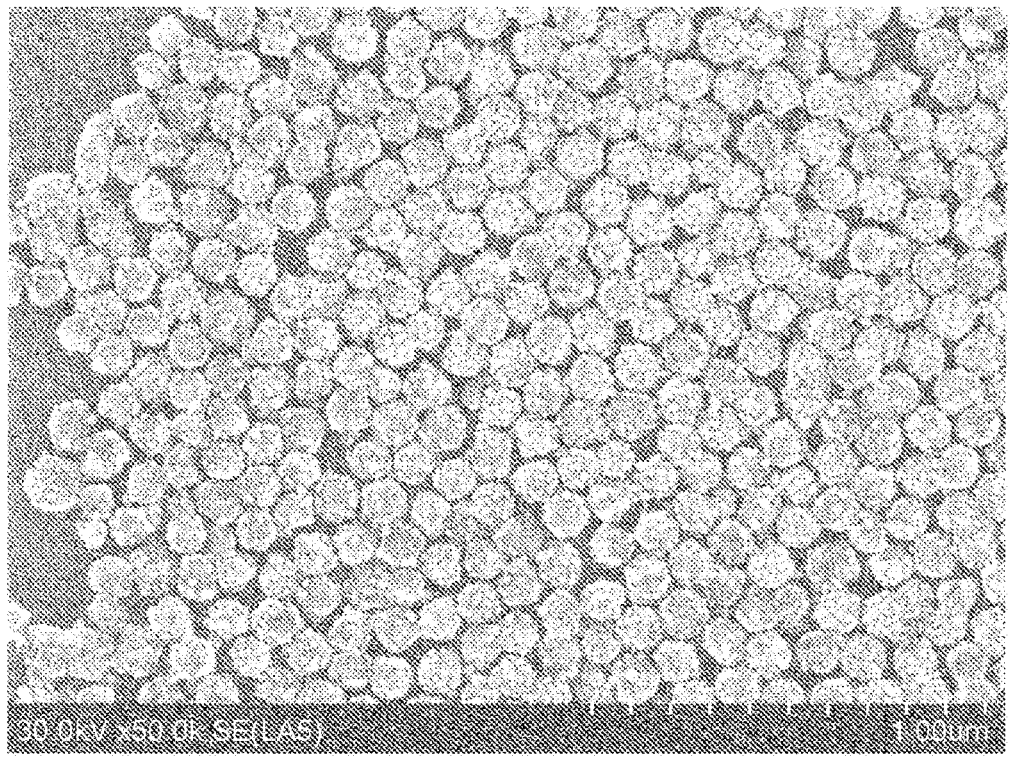
FIG. 1(a) is an SEM image obtained in Example 4.
FIG. 1(b) is a TEM image obtained in Example 4.
Figure 1:
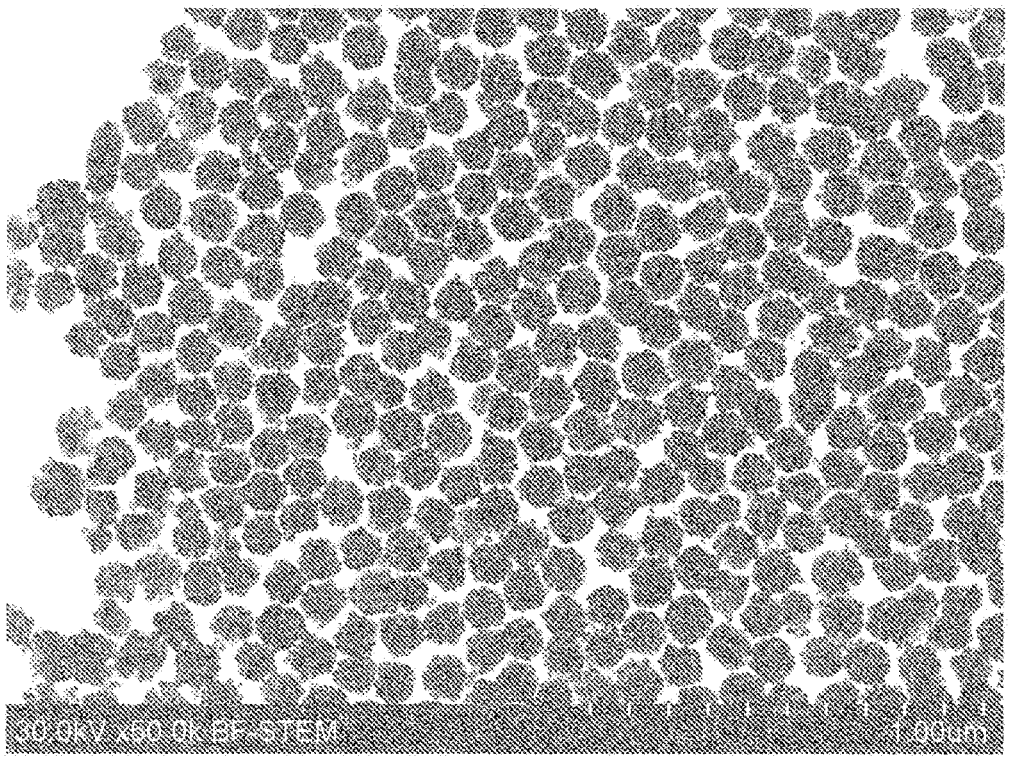

The present invention is now described.

The present invention provides a silica-based composite fine particle dispersion, child particles primarily composed of crystalline ceria being formed on surfaces of mother particles (the "mother particles" is hereinafter referred to also as "silica fine particles") primarily composed of amorphous silica, the silica-based composite fine particle dispersion comprising silica-based composite fine particles having an average particle size of 50 to 350 nm and having characteristic features of [1] to [3]:

[1] the silica-based composite fine particles have a mass ratio between silica and ceria of 100:11 to 316;
[2] a ceria crystal phase is only detected when the silica-based composite fine particles are subjected to X-ray diffractometry; and
[3] a crystallite size in the crystalline ceria, as measured by subjecting the silica-based composite fine particles to X-ray diffractometry, is 10 to 25 nm.

The silica-based composite fine particle dispersion as described above is hereinafter referred to also as "dispersion of the invention."

The silica-based composite fine particles included in the dispersion of the invention are hereinafter referred to also as "composite fine particles of the invention."

The present invention also provides a method of manufacturing a silica-based composite fine particle dispersion comprising Steps 1 to 3 described below:

Step 1: a step which comprises stirring a silica fine particle dispersion containing silica fine particles dispersed in a solvent; and continuously or discontinuously adding a metal salt of cerium while keeping a temperature at 5 to 98° C. and a pH at 7.0 to 9.0, respectively, thereby obtaining a precursor particle dispersion containing precursor particles;

Step 2: a step which comprises drying the precursor particle dispersion; burning the dried precursor particle dispersion at 400 to 1,200° C. to obtain a burned body; and subjecting the burned body to treatment of (i) or (ii) to obtain a dispersion including a burned and ground body:
(i) dry grinding followed by a solvent dispersion treatment by addition of a solvent; and
(ii) addition of a solvent followed by wet grinding; and Step 3: a step which comprises subjecting the dispersion including the burned and ground body to centrifugation at a relative centrifugal acceleration of not less than 300 G; and subsequently removing precipitated components to obtain the silica-based composite fine particle dispersion.

The relative centrifugal acceleration is expressed by a ratio with respect to the acceleration of gravity of the earth which is denoted by 1 G.

The method of manufacturing the silica-based composite fine particle dispersion as described above is hereinafter referred to also as "manufacturing method of the invention."

The dispersion of the invention is preferably manufactured by the manufacturing method of the invention.

The term "the invention" simply used in the following description refers to all of the dispersion of the invention, the composite fine particles of the invention, and the manufacturing method of the invention.

The composite fine particles of the invention are now described.

<Mother Particles>

In the composite fine particles of the invention, the mother particles are primarily composed of amorphous silica.

For instance, a method described below can be used to confirm that silica contained in the mother particles of the invention is amorphous. When an X-ray diffraction pattern is obtained by, for instance, a conventionally known X-ray diffractometer (e.g., RINT 1400 manufactured by Rigaku Corporation) after the dispersion (silica fine particle dispersion) containing the mother particles (silica fine particles) is dried and pulverized with a mortar, the X-ray diffraction pattern does not have peaks of crystalline silica such as Cristobalite. In this way, it can be confirmed that the silica contained in the mother particles (silica fine particles) are amorphous.

The expression "primarily composed of" means that the content is not less than 90 mass %. In other words, the amorphous silica content in the mother particles is not less than 90 mass %. The content is preferably not less than 95 mass %, more preferably not less than 98 mass %, and even more preferably not less than 99.5 mass %.

In the description of the invention to be given below, the expression "primarily composed of" is used for the meaning described above.

The mother particles are primarily composed of amorphous silica and may contain other components, for example, crystalline silica and impurity elements.

For instance, the elements of Na, Ag, Al, Ca, Cr, Cu, Fe, K, Mg, Ni, Ti, Zn and Zr (hereinafter often referred to as "specific impurity group 1") are preferably contained in the mother particles (silica fine particles) in amounts of not more than 100 ppm, more preferably not more than 50 ppm, even more preferably not more than 25 ppm, still more preferably not more than 5 ppm, and even still more preferably not more than 1 ppm, respectively. The elements of U, Th, Cl, $NO_3$, $SO_4$, and F (hereinafter often referred to as "specific impurity group 2") are preferably contained in the mother particles (silica fine particles) in amounts of not more than 5 ppm, respectively.

The silica fine particles generally prepared using water glass as a material contain the specific impurity group 1 and the specific impurity group 2 derived from the water glass used as the material in a total amount of about a few thousand ppm.

In the case of a silica fine particle dispersion containing the above-described silica fine particles dispersed in a solvent, it is possible to perform ion exchange treatment to reduce the contents of the specific impurity group 1 and the specific impurity group 2. Also in such a case, however, the specific impurity group 1 and the specific impurity group 2 remain in a total amount of a few ppm to a few hundred ppm. Therefore, when silica particles prepared from the water glass material are used, impurities are also reduced by acid treatment or the like.

In contrast, in the case of a silica fine particle dispersion in which silica fine particles synthesized from an alkoxysilane material are dispersed in a solvent, the element contents and the anion contents in the specific impurity group 1 and the specific impurity group 2 are usually not more than 20 ppm, respectively.

In the invention, the amounts of Na, Ag, Al, Ca, Cr, Cu, Fe, K, Mg, Ni, Ti, Zn, Zr, U, Th, Cl, $NO_3$, $SO_4$, and F contained in the mother particles (silica fine particles) are expressed by values determined through measurement using methods described below, respectively.

Na and K: atomic absorption spectrometry

Ag, Al, Ca, Cr, Cu, Fe, Mg, Ni, Ti, Zn, Zr, U, and Th: ICP (inductively coupled plasma emission spectrometry)

Cl: potentiometric titration $NO_3$, $SO_4$, and F: ion chromatography

As will be described later, the silica-based composite fine particles in the invention have an average particle size in the range of 50 to 350 nm and the mother particles have necessarily a smaller average particle size than 350 nm. In the present application, the average particle size of the mother particles is deemed to be the same as the average particle size of the silica fine particles contained in the silica fine particle dispersion used in Step 1 included in the manufacturing method of the invention to be described later. The silica-based composite fine particles in which the mother particles have an average particle size of 30 to 330 nm are advantageously used.

The average particle size of the mother particles falling within the above-described range leads to a reduced number of scratches when the dispersion of the invention is used as an abrasive. The average particle size of the mother particles in the range less than 30 nm leads to lack of the polishing rate. The average particle size of the mother particles in the range more than 330 nm rather leads to a reduced polishing rate. The surface accuracy of the substrate tends to be deteriorated.

The average particle size of the mother particles (silica fine particles) in the invention means a value measured by dynamic light scattering or laser diffraction scattering. More specifically, the average particle size of the mother particles means a value obtained through measurement using a method described below.

Silica fine particles are dispersed in water or the like to obtain a silica fine particle dispersion, and the silica fine particle dispersion is then subjected to measurement using a known particle size measuring device according to the dynamic light scattering (e.g., a Microtrac UPA device manufactured by Nikkiso Co., Ltd. or PAR-III manufactured by Otsuka Electronics Co., Ltd.) or a known measuring device according to the laser diffraction scattering (e.g., LA-950 manufactured by HORIBA, Ltd.).

The measuring device to be used is selected according to the purpose of each step and the expected particle size and particle size distribution. To be more specific, preferably, a known particle size measuring device according to the dynamic light scattering (preferably PAR-III) is used for a monodisperse silica fine particle material having a particle size of about 100 nm or less and having a narrow particle size distribution; a known measuring device according to the laser diffraction scattering (preferably LA-950) is used for measurement of a monodisperse silica fine particle material having a particle size of 100 nm or more; and a known particle size measuring device according to the dynamic light scattering and a known measuring device according to the laser diffraction scattering (preferably Microtrac UPA and LA-950) are used in the grinding step in which the particle size varies widely from micrometer level to nanometer level due to grinding.

The shape of the mother particles (silica fine particles) is not particularly limited, and the mother particles may have, for example, a spherical shape, a bale shape, a tetrahedral shape (triangular pyramid shape), a hexahedral shape, a octahedral shape, an amorphous shape, a shape having warty projections on the particle surface, a crenated shape or a porous shape. However, a spherical shape is preferred. The spherical shape means that the percentage of the number of mother particles as single particles having a ratio between the shorter diameter and the longer diameter of 0.8 or less is 10% or less. The percentage of the number of mother particles having a ratio between the shorter diameter and the longer diameter of 0.8 or less is preferably 5% or less and more preferably 0%.

The ratio between the shorter diameter and the longer diameter is measured by the same method as the method (image analysis method) of measuring the ratio between the shorter diameter and the longer diameter of the composite fine particles of the invention to be described later.

<Child Particles>

The composite fine particles of the invention have child particles formed on the surfaces of the mother particles described above. The child particles entirely coated with a silica coating may be bound to the mother particles through the silica coating. Alternatively, the child particles may be bound to the surfaces of the mother particles. Such embodiments are embodiments in which the child particles exist on the surfaces of the mother particles and are included in the technical scope of the invention.

In the composite fine particles of the invention, the child particles are primarily composed of crystalline ceria.

A ceria crystal phase is only detected on an X-ray diffraction pattern obtained by, for instance, a conventionally known X-ray diffractometer (e.g., RINT 1400 manufactured by Rigaku Corporation) after the dispersion of the invention is dried and pulverized with a mortar. It can be confirmed from this that the child particles are primarily composed of crystalline ceria. An exemplary ceria crystal phase includes Cerianite.

The child particles are primarily composed of crystalline ceria (crystalline cerium oxide) and may contain other components, for example, elements other than cerium. However, as described above, the ceria crystal phase is only detected when the composite fine particles of the invention are subjected to X-ray diffractometry. In other words, even if the child particles contain a crystal phase other than ceria, the crystal phase is out of detection range in X-ray diffractometry due to its low content.

The expression "primarily composed of" is as defined above.

As for the child particles, the crystallite size in the crystalline ceria, as measured by subjecting the composite fine particles of the invention to X-ray diffractometry, is 10 to 25 nm, preferably 11 to 23 nm, and more preferably 12 to 20 nm.

The crystallite size in the crystalline ceria is determined from the full width at half maximum of a maximum peak in an X-ray diffraction pattern. For instance, a (111) plane has an average crystallite size of 10 to 25 nm (full width at half maximum: 0.86 to 0.340), preferably 11 to 23 nm (full width at half maximum: 0.78 to 0.370), and more preferably 12 to 20 nm (full width at half maximum: 0.79 to 0.430). In many cases, the (111) plane has a maximum peak intensity but the crystal plane is not limited to the (111) plane (2θ=around 280) but another crystal plane, for example, a (100) plane may have a maximum peak intensity. The crystallite size can be calculated in the same manner also in this case, and the average crystallite size in this case may be the same as the average crystallite size of the above-described (111) plane.

The (111) plane (2θ=around 280) is taken as an example to describe below a method of measuring the average crystallite size of child particles.

First of all, the composite fine particles of the invention are pulverized with a mortar and an X-ray diffraction pattern is obtained by, for instance, a conventionally known X-ray diffractometer (e.g., RINT 1400 manufactured by Rigaku Corporation). Then, the full width at half maximum of a peak of the (111) plane (2θ=around 280) in the resulting X-ray diffraction pattern is measured and the crystallite size can be determined by the Scherrer equation shown below:

$$D = K\lambda/\beta \cos\theta$$

D: crystallite size (angstrom)
K: Scherrer constant (K=0.94)
λ: X-ray wavelength (1.7889 angstroms, Cu lamp)
β: full width at half maximum (rad)
θ: angle of reflection The child particles are smaller in size than the mother particles, and preferably have an average particle size of 11 to 26 nm and more preferably 12 to 23 nm. The size of the child particles means a value obtained by simply averaging average particle size measurements of arbitrary 50 child particles in a projection image enlarged at a magnification of 300,000× using a scanning electron microscope.

<Silica Coating>

Each of the composite fine particles of the invention preferably has the child particles formed on the surface of the mother particle and further has a silica coating on the surfaces of the child particles. The child particles are bound to the surface of the mother particle and may be further covered with the silica coating. In other words, a part or the whole of the composite particle having the child particles bound to the surface of the mother particle may be covered with the silica coating. Therefore, the silica coating is more preferably present at the outermost surface of each composite fine particle of the invention.

When the composite fine particle of the invention has the silica coating formed on the surfaces of the child particles, according to an image (TEM image) obtained through observation with a transmission electron microscope, an image of the child particles densely appears on the surface of the mother particle but the silica coating appears as a relatively light image on the outside of the child particles, i.e., on the surface side of the composite fine particle. In this embodiment, the child particles (ceria fine particles) may be bound to the mother particle (silica fine particle) or the child particles wholly or partially coated with the silica coating may be bound to the mother particle through the silica coating.

Further, when the composite fine particle of the invention has the silica coating on the surfaces of the child particles, according to the element distribution after EDS analysis of the composite fine particle of the invention, a high Ce concentration portion appears on the surface side of the particle and a high Si concentration portion appears outside the high Ce concentration portion.

As a result of determination of the percentage of the number of Si atoms and the percentage of the number of Ce atoms in a portion of the silica coating specified by a transmission electron microscope as described above through EDS measurement including selective application of electron beams, it can be seen that the percentage of the number of Si atoms is very high. More specifically, the ratio of the percentage of the number of Si atoms to the percentage of the number of Ce atoms (Si atom %/Ce atom %) is preferably not less than 0.9.

It is deemed that the silica coating as described above promotes binding (force) between the child particles (ceria crystal particles) and the mother particles (silica fine particles). Therefore, the silica-based composite fine particle dispersion is obtained by, for instance, subjecting the silica-based composite fine particles obtained by burning to wet grinding in the step of obtaining the dispersion of the invention, but it is deemed that the silica coating has the effect of preventing the child particles (ceria crystal particles) from being separated from the mother particles (silica fine particles). In this case, there is no problem of local separation of the child particles, and the whole surfaces of the child particles may not be coated with the silica coating. The child particles need only have sufficient stiffness to prevent the child particles from being separated from the mother particles in the grinding step. When the dispersion of the invention is used as an abrasive, it is deemed that having such a structure is effective in having a high polishing rate and less deterioration in surface accuracy and scratches.

Further, in the composite fine particles of the invention, at least a part of the surface of each child particle is covered with the silica layer and an OH group of silica is therefore present on the uppermost layer (outermost layer) of each of the composite fine particles of the invention. Therefore, it is deemed that when used as an abrasive, the composite fine particles of the invention repel each other due to electric charges from —OH groups at the polished substrate surface, and as a result, are less attached to the polished substrate surface.

Free ceria has a positive electric charge and is therefore more likely to be attached to the substrate. When the composite fine particles of the invention have the silica coating on the surfaces of the child particles, even if the ceria particles as the child particles come off during polishing, their surfaces are coated with silica and have therefore a negative electric charge and also have the effect of reducing attachment to the substrate.

Ceria has a different potential from silica, a polished substrate and a polishing pad, and the negative zeta potential decreases at a pH ranging from an alkaline value to the vicinity of a neutral value, and a weakly acidic region has an opposite positive potential. Therefore, ceria is more likely to be attached to the polished substrate and the polishing pad due to differences in magnitude of the potential and the polarity, to thereby remain on the polished substrate and the polishing pad. On the other hand, when the composite fine particles of the invention have the silica coating on the surfaces of the child particles, in the silica-based composite fine particles of the invention, at least a part of ceria serving as the child particles is covered with the silica coating and the pH therefore maintains a negative potential in the range from the alkaline pH to the acidic pH, and abrasive grains are less likely to remain on the polished substrate and the polishing pad.

When the composite fine particles of the invention have the silica coating on the surfaces of the child particles, the thickness of the silica coating is approximately determined from a TEM image or an SEM image by the degree to which the ceria child particles on the mother particles are coated with the silica coating. In other words, as described above, according to the TEM image, an image of child particles having a particle size of about 20 nm densely appears on the surface of a mother particle, and a silica coating appears outside the child particles as a relatively light film, and the thickness of the silica coating can be therefore approximately determined by comparing with the size of the child particles. It is deemed that the thickness of the silica coating may be considerably below 20 nm if the child particles can be clearly seen as irregularities on the SEM image and the irregularities are seen on the peripheries of the silica-based composite fine particles on the TEM image. On the other hand, it is deemed that the thickness of the silica coating is around 20 nm if the child particles do not have clear irregularities on the SEM image and the irregularities are not seen on the peripheries of the silica-based composite fine particles on the TEM image.

When the composite fine particles of the invention have the silica coating on the surfaces of the child particles, the silica coating serving as the outermost layer (layer on the opposite side to the mother particle side) as described above may not entirely cover the whole of the child particles (ceria fine particles). In other words, when the composite fine particles of the invention have the silica coating on the surfaces of the child particles, the silica coating is present at the outermost surfaces of the composite fine particles of the invention but the outermost surfaces of the composite fine particles of the invention may not be covered in part with the silica coating. Further, portions where the mother particles of the silica-based composite fine particles are exposed may be present.

<Composite Fine Particles of the Invention>

As described above, the composite fine particles of the invention have the above-described child particles formed on the surfaces of the mother particles.

The mass ratio between silica and ceria in the composite fine particles of the invention is 100:11 to 316, preferably 100:30 to 230, more preferably 100:30 to 150, and even more preferably 100:60 to 120. The mass ratio between silica and ceria is deemed to be approximately equal to the mass ratio between the mother particles and the child particles. If the amount of the child particles with respect to that of the mother particles is below the above range, the mother particles may be bound together to generate coarse particles. In such a case, the abrasive (polishing abrasive grain dispersion) containing the dispersion of the invention may generate defects (reduction in surface accuracy including an increase in number of scratches) on a surface of a polished substrate. If the amount of ceria with respect to that of silica exceed the above range, costs are not only increased but risk of resources is also increased. The particles are further bound together. As a result, this may cause troubles such as an increase in substrate surface roughness (an increase in surface roughness Ra), an increase in number of scratches, and further free ceria remaining on a substrate, and attachment to wastewater piping or the like of a polishing device.

Silica to be used for calculating the mass ratio contains all of (I) to (III):
(I) a silica component making up the mother particles;
(II) a silica component included in the silica coating covering the composite fine particles, each of which includes child particles (ceria component) bound to a mother particle; and
(III) a silica component which enters into solid solution in the ceria child particles.

The amounts (mass %) of silica ($SiO_2$) and ceria ($CeO_2$) contained in the composite fine particles of the invention are determined as follows: The solids concentration of the composite fine particle dispersion of the invention (dispersion of the invention) is first determined by weighing after loss on ignition at 1,000° C.

Next, the amount (mass %) of cerium (Ce) contained in a specified amount of the composite fine particles of the invention is determined by ICP plasma emission spectrometry and is calculated in terms of $CeO_2$ mass %. Then, $SiO_2$ mass % can be calculated assuming that the component other than $CeO_2$ in the composite fine particles of the invention is $SiO_2$.

In the manufacturing method of the invention, the mass ratio between silica and ceria can also be calculated from the amounts of silica source materials and ceria source materials introduced to prepare the dispersion of the invention. This can be applied to a case which does not include a process in which ceria and silica are dissolved and removed, and a case which includes a process in which ceria and silica are dissolved and removed but in which the amount of dissolution is excessively small. In such a case, there is a good coincidence between the amounts of ceria and silica used, and analysis values.

The composite fine particles of the invention may be formed by binding the granular crystalline ceria (child particles) to the surfaces of the silica fine particles (mother particles) through sintering or the like. In this case, the composite fine particles of the invention have an irregular surface shape.

In other words, at least one of the mother particles and the child particles (preferably both) are preferably bound together by sintering at their contact points to form strong bonding. However, there is also a case in which the child particles covered with the silica coating are bound to the mother particles through the silica coating.

In the composite fine particles of the invention, silicon atoms preferably enter into solid solution in the crystalline ceria as a main component of the child particles. Elements other than silicon atoms may enter into solid solution in the crystalline ceria. The expression "enter into solid solution" generally means that two or more elements (which may be metal or non-metal elements) are dissolved in each other to form a uniform solid phase as a whole, and the solid solution obtained by this process is classified into substitutional solid solution and interstitial solid solution. Substitutional solid solution may easily take place between atoms having atomic radii close to each other. However, at least substitutional solid solution is less likely to take place between Ce and Si which have atomic radii considerably different from each other. In the Cerianite crystal structure, the coordination number of Ce seen from the center of Ce is 8 but should be 7 when Si is, for instance, substituted with Ce at a ratio of 1:1. However, in a preferred embodiment of the composite fine particles of the invention, according to the analysis, the average coordination number of Ce seen from the center of Ce is, for example, 7.9 and further the average coordination number of Si is, for example, 1.1, and it is therefore assumed that the state of solid solution is interstitial type in the preferred embodiment of the composite fine particles of the invention. Furthermore, in the preferred embodiment of the composite fine particles of the invention, the interatomic distance between adjacent Ce and Si is smaller than that between adjacent Ce and Ce, and it is therefore assumed that the state of solid solution is interstitial type in the preferred embodiment of the composite fine particles of the invention. More specifically, as for cerium atoms and silicon atoms included in the child particles, a relationship of $R_1 < R_2$ (where $R_1$ is a distance between cerium and silicon atoms, and $R_2$ is a distance between cerium atoms) is preferably satisfied.

It has conventionally been known that, as compared to the case of using other inorganic oxide particles, a specifically high polishing rate is exhibited when polishing a silica film-coated substrate or a glass substrate using ceria particles as abrasive grains. It is pointed out that one of the reasons why the ceria particles exhibit a particularly high polishing rate on the silica film-coated substrate is that the ceria particles have high chemical reactivity with respect to the silica coating on the substrate to be polished.

In the preferred embodiment of the composite fine particles of the invention, Si atoms are deemed to enter into interstitial solid solution in $CeO_2$ crystals in the child particles (ceria fine particles) present on the outermost side. It is assumed that Si atoms enter into solid solution to cause crystal distortion of $CeO_2$ crystals to accelerate chemical reactivity of $CeO_2$, resulting in the high polishing rate.

The interatomic distances of cerium atoms and silicon atoms expressed by $R_1$ and $R_2$, respectively, refer to average bond distances obtained by measurement according to the method to be described in Examples to be referred to later.

In the composite fine particles of the invention, the percentage of the number of particles having a ratio between their shorter diameter and longer diameter, as measured by the image analysis method, of not more than 0.80 may be not more than 35%.

It is deemed, in principle, that particles having a ratio between their shorter diameter and longer diameter, as measured by the image analysis method, of not more than 0.80 are of a particle binding type, and particles having a ratio between their shorter diameter and longer diameter of more than 0.80 are pearl-like single particles. It is also deemed that, when the percentage of the number of particles having a ratio between their shorter diameter and longer diameter of not more than 0.80 is not more than 35%, the composite fine particles are primarily composed of pearl-like single particles.

The composite fine particles of the invention may be pearl-like single particles or have other shapes such as particle-binding type in addition to the pearl-like shape. Pearl-like single particles can easily achieve the objective that the percentage of the number of particles having a ratio between the shorter diameter and the longer diameter of not more than 0.8 is not more than 35%. When polishing is performed using such particles, there is a tendency to achieve very good smoothness without polishing scratches at the polished substrate surfaces, because the particles do not include coarse agglomerates that may cause scratches. On the other hand, when the percentage of the number of particles having a ratio between their shorter diameter and longer diameter of not more than 0.8 is not more than 35%, polishing scratches and surface roughness are substantially less adversely affected.

A method of measuring the ratio between the shorter diameter and the longer diameter by means of the image analysis method is described. In a projection image obtained by shooting the composite fine particles of the invention with a transmission electron microscope at a magnification of 250,000× (or 500,000×), the maximum diameter of a particle is deemed as the major axis and its length is measured and the measured value is taken as a longer diameter (DL). A point dividing the major axis length on the major axis into two halves is determined. Two points of intersection of a line orthogonal to the major axis at the point with the periphery of the particle are determined, and the distance between the two points is measured and taken as a shorter diameter (DS). Then, the ratio between the shorter diameter and the longer diameter (DS/DL) is determined. The percentage (%) of the number of particles having the ratio between the shorter diameter and the longer diameter of not more than 0.80 is determined in arbitrary 50 particles observed in the projection image.

The composite fine particles of the invention preferably have a specific surface area of 4 to 100 m$^2$/g, and more preferably 20 to 60 m$^2$/g.

A method of measuring the specific surface area (BET specific surface area) is now described.

First, a dried sample (0.2 g) is placed in a measurement cell and subjected to degassing treatment at 250° C. for 40 minutes in a nitrogen gas stream. The sample is maintained at the liquid nitrogen temperature in a gas mixture stream of 30 vol % nitrogen and 70 vol % helium to cause equilibrium adsorption of nitrogen onto the sample. Next, the temperature of the sample is gradually increased to room temperature while flowing the gas mixture, the amount of nitrogen detached during this process is detected, and the specific surface area of the sample is measured from a previously prepared calibration curve.

The BET specific surface area measuring method (nitrogen adsorption method) as described above can be performed using, for example, a conventionally known surface area measuring device.

Unless otherwise specified, the specific surface area in the invention means a value obtained through measurement using the method described above.

The composite fine particles of the invention preferably have an average particle size of 50 to 350 nm and more preferably 170 to 260 nm. The composite fine particles of the invention preferably have an average particle size ranging from 50 to 350 nm, because the polishing rate is increased when the composite fine particles are used as an abrasive material.

The average particle size of the composite fine particles of the invention means a value measured by dynamic light scattering or laser diffraction scattering. More specifically, the average particle size of the composite fine particles means a value obtained through measurement using a method described below. The composite fine particles of the invention are dispersed in water to obtain a composite fine particle dispersion, and the composite fine particle dispersion is then subjected to measurement using a known particle size measuring device according to the dynamic light scattering (e.g., a Microtrac UPA device manufactured by Nikkiso Co., Ltd. or PAR-III manufactured by Otsuka Electronics Co., Ltd.) or a known measuring device according to the laser diffraction scattering (e.g., LA-950 manufactured by HORIBA, Ltd.).

The elements of the specific impurity group 1 are preferably contained in the composite fine particles in amounts of not more than 100 ppm, more preferably not more than 50 ppm, even more preferably not more than 25 ppm, still more preferably not more than 5 ppm, and even still more preferably not more than 1 ppm, respectively. The elements of the specific impurity group 2 are preferably contained in the composite fine particles of the invention in amounts of not more than 5 ppm, respectively. The method described on the mother particles (silica fine particles) can be applied as a method of reducing the amounts of the elements in the specific impurity group 1 and the specific impurity group 2 contained in the composite fine particles of the invention.

As in the case of the above-described mother particles, the amounts of the elements in the specific impurity group 1 and the specific impurity group 2 contained in the composite fine particles of the invention are values obtained through measurement using atomic absorption spectrometry, ICP (inductively coupled plasma emission spectrometer), potentiometric titration, and ion chromatography.

The composite fine particles of the invention include a case of composite oxide fine particles in which the amounts of the elements in the specific impurity group 1 are not more than 100 ppm, respectively, and the amounts of the elements in the specific impurity group 2 are not more than 5 ppm, respectively, and a case of composite oxide fine particles in which the above conditions are not necessarily satisfied. Of these, the former can be advantageously used as an abrasive in uses in which application of a high-purity abrasive is required, for example, an application for polishing semiconductor devices such as a semiconductor substrate and a circuit board. The latter is applied to uses in which application of a high-purity abrasive is not required, for example, to polish glass. The former can be of course also applied to uses in which application of a high-purity abrasive is not required.

<Dispersion of the Invention>

The dispersion of the invention is now described.

The dispersion of the invention includes the above-mentioned composite fine particles of the invention dispersed in a dispersion solvent.

The dispersion of the invention contains water and/or an organic solvent as a dispersion solvent. Water such as pure water, ultrapure water, or ion exchanged water is preferably used as the dispersion solvent. Further, the dispersion of the invention is advantageously used as a polishing slurry by adding one or more additives for controlling the polishing performance, which are selected from the group consisting of a polishing accelerator, a surfactant, a pH adjuster, and a pH buffer.

An organic solvent can be used as the dispersion solvent included in the dispersion of the invention. Examples of the organic solvent include alcohols such as methanol, ethanol, isopropanol, n-butanol, and methyl isobutyl carbinol; ketones such as acetone, 2-butanone, ethyl amyl ketone, diacetone alcohol, isophorone, and cyclohexanone; amides such as N, N-dimethylformamide, and N,N-dimethylacetamide; ethers such as diethyl ether, isopropyl ether, tetrahydrofuran, 1,4-dioxane, and 3,4-dihydro-2H-pyran; glycol ethers such as 2-methoxyethanol, 2-ethoxyethanol, 2-butoxyethanol, and ethylene glycol dimethyl ether; glycol ether acetates such as 2-methoxyethyl acetate, 2-ethoxyethyl acetate, and 2-butoxyethyl acetate; esters such as methyl acetate, ethyl acetate, isobutyl acetate, amyl acetate, ethyl lactate, and ethylene carbonate; aromatic hydrocarbons such as benzene, toluene and xylene; aliphatic hydrocarbons such as hexane, heptane, isooctane, and cyclohexane; halogenated hydrocarbons such as methylene chloride, 1,2-dichloroethane, dichloropropane, and chlorobenzene; sulfoxides such as dimethyl sulfoxide; pyrrolidones such as N-methyl-2-pyrrolidone, and N-octyl-2-pyrrolidone. These may be mixed with water for use.

The solids concentration in the dispersion of the invention is preferably in the range of 0.3 to 50 mass %.

When cation colloidal titration is performed, the dispersion of the invention preferably provides a streaming potential curve in which the ratio (ΔPCD/V) between the amount of streaming potential change (ΔPCD) and the amount of cation colloidal titrant added at a knick (V) as expressed by formula (1) is in the range of −110.0 to −15.0.

$$\Delta PCD/V = (I-C)/V \quad \text{formula (1)}$$

C: streaming potential (mV) at the knick

I: streaming potential (mV) at a starting point of the streaming potential curve; and V: amount of the cation colloidal titrant added at the knick (mL).

Cationic colloidal titration is performed by adding the cation colloidal titrant to 80 g of the dispersion of the invention which is adjusted to a solids concentration of 1 mass %. A 0.001 N polydiallyl dimethyl ammonium chloride solution is used as the cation colloidal titrant. As for the other measurement conditions, measurement is performed by a suitable method according to common methods described in literatures or recommended by manufactures.

The streaming potential curve obtained by the cation colloidal titration is a graph that takes the amount (mL) of cationic titrant added on the x-axis and the streaming potential (mV) of the dispersion of the invention on the y-axis.

The knick is a point (inflection point) where the streaming potential abruptly changes in the streaming potential curve obtained by the cation colloidal titration. Then, the streaming potential at the inflection point is denoted by C (mV) and the amount of cation colloidal titrant added at the inflection point is denoted by V (mL).

The starting point of the streaming potential curve shows a streaming potential in the dispersion of the invention before titration. More specifically, a point where the amount of cation colloidal titrant added is 0 is taken as the starting point. The streaming potential at this point is denoted by I (mV).

When ΔPCD/V has a value of −110.0 to −15.0, the polishing rate of an abrasive is further improved when the dispersion of the invention is used as the abrasive. It is deemed that ΔPCD/V reflects the degree to which the surfaces of the composite fine particles of the invention are coated with the silica coating and/or the degree to which the child particles are exposed at the surfaces of the composite fine particles or the presence of easily detachable silica. The inventors of the invention assume that when ΔPCD/V has a value within the above-defined range, the child particles are less likely to be detached in wet grinding, and the polishing rate is also high. When ΔPCD/V has a larger absolute value than −110.0 to the contrary, the surfaces of the composite fine particles are entirely covered with the silica coating and the child particles are therefore less likely to come off in the grinding step. However, silica is less likely to be detached during polishing to reduce the polishing rate. On the other hand, it is deemed that the child particles are more likely to come off when ΔPCD/V has a smaller absolute value than −15.0. The inventors of the invention assume that when ΔPCD/V is within the above-defined range, the surfaces of the child particles are properly exposed during polishing, leading to less coming off of the child particles, and the polishing rate is further improved. ΔPCD/V is more preferably −100.0 to −15.0, and even more preferably −100.0 to −20.0.

When the pH value is in the range of 3 to 8, the dispersion of the invention preferably has a negative streaming potential before starting cation colloidal titration, that is, when the titer is 0. This is because when the streaming potential keeps a negative potential, the abrasive grains (silica-based composite fine particles) are less likely to remain on a polished substrate also showing a negative surface potential.

The method of manufacturing the dispersion of the invention is not particularly limited, and the dispersion of the invention is preferably manufactured by the manufacturing method of the invention to be described below.

<Manufacturing Method of the Invention>

The manufacturing method of the invention is now described.

The manufacturing method of the invention includes Step 1 to Step 3 to be described below.

<Manufacturing Method of the Invention>
<Step 1>

A silica fine particle dispersion containing silica fine particles dispersed in a solvent is prepared in Step 1.

When a silica-based composite fine particle dispersion to be applied to polish a semiconductor device or the like is prepared by the manufacturing method of the invention, a silica fine particle dispersion in which silica fine particles prepared by hydrolyzing alkoxysilane are dispersed in a solvent is preferably used. When a conventionally known silica fine particle dispersion (e.g., silica fine particle dispersion prepared by using a water glass material) is used as a material, the silica fine particle dispersion is preferably subjected to acid treatment and further deionization treatment before use. In this case, the amounts of Na, Ag, Al, Ca, Cr, Cu, Fe, K, Mg, Ni, Ti, Zn, Zr, U, Th, Cl, $NO_3$, $SO_4$, and F contained in the silica fine particles are reduced. More specifically, the amounts may be reduced to 100 ppm or less.

To be more specific, fine particles satisfying conditions (a) and (b) below are advantageously used as the silica fine particles in the silica fine particle dispersion serving as the material used in Step 1.

(a) Na, Ag, Al, Ca, Cr, Cu, Fe, K, Mg, Ni, Ti, Zn, and Zr are contained in amounts of not more than 100 ppm, respectively; and (b) U, Th, Cl, $NO_3$, $SO_4$, and F are contained in amounts of not more than 5 ppm, respectively.

The silica fine particles preferably have an average particle size of 30 to 330 nm and a ratio between the shorter diameter and the longer diameter, as measured by the image analysis method, of 0.95 to 1.0.

Step 1 includes stirring the silica fine particle dispersion containing the silica fine particles as described above dispersed in a solvent; and continuously or discontinuously adding a metal salt of cerium while maintaining the silica fine particle dispersion at a temperature of 5 to 98° C. and a pH of 7.0 to 9.0, thereby obtaining a precursor particle dispersion containing precursor particles.

The dispersion medium in the silica fine particle dispersion preferably contains water, and an aqueous silica fine particle dispersion (aqueous sol) is preferably used.

The solids concentration in the silica fine particle dispersion is preferably 1 to 40 mass % in terms of $SiO_2$. When the solids concentration is too low, the silica concentration in the manufacturing step is reduced, thus leading to lower productivity.

It is possible to extract impurities with a cation exchange resin, an anion exchange resin, a mineral acid or an organic acid and, if necessary, deionize the silica fine particle dispersion using an ultrafiltration membrane. The silica fine particle dispersion from which impurity ions were removed by deionization treatment is more preferred because a silicon-containing hydroxide is easily formed on its surface. The deionization treatment is not limited thereto.

In Step 1, the silica fine particle dispersion as described above is stirred, and a metal salt of cerium is continuously or discontinuously added while maintaining the silica fine particle dispersion at a temperature of 5 to 98° C. and a pH of 7.0 to 9.0.

The metal salt of cerium is not limited, and a chloride, a nitrate, a sulfate, an acetate, a carbonate, and a metal alkoxide of cerium can be used. Specific examples thereof include cerous nitrate, cerium carbonate, cerous sulfate, and cerous chloride. Of these, cerous nitrate and cerous chloride are preferred. These materials are preferred, because a solution supersaturated at the same time as neutralization produces cerium hydroxide and crystalline cerium oxide, which promptly adhere to silica fine particles by means of an aggregation and deposition mechanism, and the efficiency in bonding oxide formation is high. However, sulfate ions, chloride ions and nitrate ions included in the metal salts exhibit corrosive properties. Therefore, it is necessary to perform cleaning in the post-process after mixing to remove the ions to 5 ppm or less. On the other hand, a carbonate and an alkoxide are preferred because the former is released during mixing as carbonic acid gas and the latter is decomposed into alcohol.

The metal salt of cerium is added to the silica fine particle dispersion such that the mass ratio between silica and ceria in the resulting composite fine particles of the invention falls within the range of 100:11 to 316, as described above.

In the method of manufacturing the silica-based composite fine particle dispersion of the invention, an aqueous cerium metal salt solution obtained by adding water, an aqueous solvent, an acid or the like to a metal salt of cerium is usually used as the metal salt of cerium. The ceria concentration in the aqueous cerium metal salt solution is not particularly limited, and is preferably in the range of 1 to 40 mass % in consideration of workability or the like.

The temperature at the time of stirring after addition of the metal salt of cerium to the silica fine particle dispersion is 5 to 98° C. and preferably 10 to 95° C. It is assumed that, when the temperature is too low, the solubility of silica is considerably reduced to hinder control of the crystallization of ceria, thus generating coarse crystalline ceria oxide, and deposition to the silica fine particles (mother particles) is less likely to occur.

When the temperature is too high to the contrary, the solubility of silica is considerably increased to suppress generation of crystalline ceria oxide. Further, scale is more likely to occur on a wall surface of a reactor. Therefore, the temperature which is too high is not preferred.

The stirring time is preferably 0.5 to 24 hours, and more preferably 0.5 to 18 hours. When the time is too short, crystalline cerium oxide cannot be sufficiently formed, which is therefore not preferred. Even when the time is too long to the contrary, a reaction for forming crystalline cerium oxide does not further proceed, which is not economical. The silica fine particle dispersion may be aged at 5 to 98° C. as desired after addition of the metal salt of cerium. A reaction for depositing the cerium compound to the mother particles can be further accelerated by aging.

When the metal salt of cerium is added to the silica fine particle dispersion and stirred, the silica fine particle dispersion has a pH of 7.0 to 9.0, and preferably 7.6 to 8.6. When the pH is too high, the salt concentration in the system is increased so much that aggregation of particles proceeds, which is not preferred. When the pH is not more than 7.0, cerium remains in the solution in the state of cerium ions and is not deposited on the surfaces of particles, which is not preferred. In this case, it is preferred to perform pH adjustment by adding an alkali or the like. Examples of the alkali that may be used include known alkalis. More specifically, exemplary alkalis include an aqueous ammonia solution, and other aqueous solutions of alkali hydroxides, alkaline-earth metals and amines, but the alkali is not limited thereto.

The dispersion containing particles (precursor particles) serving as the precursor of the composite fine particles of the invention (i.e., precursor particle dispersion) can be obtained by Step 1 as described above.

The precursor particle dispersion obtained in Step 1 may be further diluted or concentrated with pure water or ion exchanged water before being subjected to the subsequent Step 2.

The solids concentration in the precursor particle dispersion is preferably 1 to 27 mass %.

The precursor particle dispersion may be subjected as desired to deionization treatment using a cation exchange resin, an anion exchange resin, an ultrafiltration membrane, an ion-exchange membrane, and centrifugation.

More advantageously, Step 1 is performed by continuously or discontinuously adding a metal salt of cerium while maintaining the silica fine particle dispersion at a temperature ranging from 5 to 52° C. and a pH ranging from 7.0 to 9.0, thereby preparing a precursor particle dispersion; and further aging the precursor particle dispersion at a temperature of 5 to 52° C. When Step 1 is performed under the above-mentioned conditions, a liquid phase reaction takes place between the metal salt of cerium or cerium hydroxide and silica to generate a cerium silicate compound, thus hindering growth of ceria crystals. Ceria fine crystals are also generated at the same time to form the cerium silicate compound and the ceria fine crystals on the mother particles.

<Step 2>

In Step 2, the precursor particle dispersion is dried and then burned at 400 to 1,200° C.

The drying method is not particularly limited. A conventionally known dryer can be used to perform drying. Specific examples of the dryer that can be used include a compartment dryer, a band dryer, and a spray dryer. Advantageously, it is recommendable to adjust the precursor particle dispersion before drying to a pH of 6.0 to 7.0, because strong aggregation can be prevented from occurring by adjusting the precursor particle dispersion before drying to a pH of 6.0 to 7.0.

The burning temperature after drying is 400 to 1,200° C., preferably 800 to 1,100° C., and more preferably 1,000 to 1,090° C. When burning is performed in the above-described temperature range, cerium is diffused from the cerium silicate compound on the mother particles to cause crystallization of ceria to sufficiently proceed, consequently leading to coating of the ceria particles with the silica layer. The silica coating present on the surfaces of the ceria fine particles is increased in thickness to have a proper thickness, whereby the mother particles are firmly bound to the child particles. When the temperature is too high, abnormal growth of ceria crystals and thickening of the silica coating on the ceria particles cause bonding with the mother particles to proceed. However, it is also expected to thickly cover the ceria child particles, and amorphous silica making up the mother particles may be crystallized or particles may be fused together.

In Step 2, the burned body obtained by burning is subjected to treatment of (i) or (ii) to obtain a dispersion including a burned and ground body.

(i) dry grinding followed by a solvent dispersion treatment by addition of a solvent; and (ii) addition of a solvent followed by wet grinding.

A conventionally known device can be used as a dry grinding device and examples thereof include an attritor, a ball mill, a vibrating mill, and a vibrating ball mill.

A conventionally known device can also be used as a wet grinding device, and examples thereof include a batch type bead mill such as a basket mill, continuous type bead mills such as horizontal type, vertical type and annular type bead mills, a sand grinder mill, a ball mill, a rotor/stator type homogenizer, an ultrasonic dispersion type homogenizer, and a wet medium stirring mill (wet grinder) such as an impact grinder where fine particles in a dispersion are made to collide against each other. Examples of the beads that may be used in the wet medium stirring mill include beads made from materials such as glass, alumina, zirconia, steel, and flint.

In any of the treatments (i) and (ii), water and/or an organic solvent is used as a solvent. For example, water such as pure water, ultrapure water, or ion exchanged water is preferably used. The solids concentration in the dispersion including the burned and ground body that is obtained by the treatment (i) or (ii) is not particularly limited, and is preferably in the range of, for example, 0.3 to 50 mass %, and more preferably 10 to 30 mass %. Of the treatments (i) and (ii), the wet treatment of (ii) is more advantageously used in practical use.

When the wet grinding in (ii) is performed, the wet grinding is preferably performed while maintaining the solvent at a pH of 8.6 to 10.8. If the pH is kept in this range, it is possible to finally obtain with more ease the silica-based composite fine particle dispersion that provides a streaming potential curve in which the ratio ($\Delta$PCD/V) between the amount of streaming potential change ($\Delta$PCD) and the amount of cation colloidal titrant added at the knick (V) as expressed by formula (1) is in the range of −110.0 to −15.0 when cation colloidal titration is performed.

In other words, grinding is preferably performed to such an extent that the dispersion of the invention corresponding to the above-described preferred embodiment is obtained, because, as described above, the polishing rate is further improved when the dispersion of the invention corresponding to the preferred embodiment is used as an abrasive. In this regard, the inventors of the invention assume that the silica coating at the surfaces of the composite fine particles of the invention is suitably reduced in thickness and/or the child particles are suitably exposed at a part of the surface of each of the composite fine particles, whereby the polishing rate can be further improved and coming off of the ceria child particles can be controlled. It is also assumed that the silica coating is thin or comes off and the child particles are therefore more likely to be detached to some extent during polishing. $\Delta$PCD/V is more preferably −100.0 to −15.0, and even more preferably −100.0 to −20.0.

<Step 3>

In Step 3, the dispersion including the burned and ground body that was obtained in Step 2 is centrifuged at a relative centrifugal acceleration of not less than 300 G, and subsequently precipitated components are removed to obtain the silica-based composite fine particle dispersion.

More specifically, coarse particles and particles bonded together having a ratio between the shorter diameter and the longer diameter of less than 0.8 are removed from the dispersion including the burned and ground body through classification using a centrifugation process. The relative centrifugal acceleration in the centrifugation process is set to 300 G or more. The silica-based composite fine particle dispersion can be obtained by removing the precipitated components after the centrifugation process. The upper limit of the relative centrifugal acceleration is not particularly limited and the relative centrifugal acceleration of 10,000 G or less is practically used.

It is necessary in Step 3 to include a centrifugation process satisfying the conditions described above. When the centrifugal acceleration does not satisfy the conditions described above, coarse particles remain in the silica-based composite fine particle dispersion, which may therefore cause scratches when the silica-based composite fine particle dispersion is used for polishing as an abrasive using the silica-based composite fine particle dispersion.

According to the invention, the silica-based composite fine particles can be obtained by further drying the silica-based composite fine particle dispersion obtained by the manufacturing method described above. The drying method is not particularly limited, and a conventionally known dryer can be used to perform drying.

The dispersion of the invention can be obtained by the manufacturing method of the invention as described above.

When a metal salt of cerium is added to the silica fine particle dispersion, the mixed solution desirably takes a positive oxidation-reduction potential value because when the oxidation-reduction potential takes a negative value, plate- or rod-like cerium single particles tend to be generated instead of deposition of the cerium compound onto the surfaces of the silica particles. Examples of the method of keeping the oxidation-reduction potential at a positive value include a method of adding an oxidizing agent such as hydrogen peroxide and a method of blowing air. The method is, however, not limited thereto.

<Polishing Abrasive Grain Dispersion>

A liquid containing the dispersion of the invention can be preferably used as the polishing abrasive grain dispersion (hereinafter referred to also as "polishing abrasive grain dispersion of the invention"). In particular, the liquid can be advantageously used as the polishing abrasive grain dispersion for flattening a semiconductor substrate having an $SiO_2$ insulating film formed thereon and a glass substrate. When the polishing abrasive grain dispersion of the invention is used to flatten a semiconductor substrate having a silica film formed thereon, the polishing abrasive grain dispersion of the invention is preferably adjusted to a pH of 3 to 8.

The polishing abrasive grain dispersion of the invention has excellent effects including a high polishing rate in polishing a semiconductor substrate or the like, a small number of flaws (scratches) at a polished surface in the process of polishing, and a small amount of residual abrasive grains on a substrate.

The polishing abrasive grain dispersion of the invention contains water and/or an organic solvent as a dispersion solvent. Water such as pure water, ultrapure water, or ion exchanged water is preferably used as the dispersion solvent. Further, the polishing abrasive grain dispersion of the invention is advantageously used as a polishing slurry by adding one or more additives for controlling the polishing performance, which are selected from the group consisting of a polishing accelerator, a surfactant, a heterocyclic compound, a pH adjuster, and a pH buffer.

The polishing abrasive grain dispersion of the invention preferably contains the composite fine particles of the invention and further contains an acidic compound having an acid dissociation constant (pKa) of not less than 1.5. The acidic compound content in the polishing abrasive grain dispersion of the invention is preferably 0.0002 to 0.1 mass %.

The polishing rate is improved when the polishing abrasive grain dispersion contains an acidic compound having an acid dissociation constant (pKa) of 1.5 or more.

Examples of the acidic compound having an acid dissociation constant (pKa) of not less than 1.5 include acetic acid, lactic acid, formic acid, malic acid, benzoic acid, citric acid, tartaric acid, phosphoric acid, and carbonic acid.

Examples of the acidic compound having an acid dissociation constant (pKa) of less than 1.5 to the contrary include nitric acid, sulfuric acid, hydrochloric acid, perchloric acid, hydrobromic acid, and trichloroacetic acid.

In the invention, the acid dissociation constant means an acid dissociation constant using water at 25° C. as a solvent.

The polishing abrasive grain dispersion of the invention preferably contains the composite fine particles of the invention and has an ionic strength of not less than 0.007. The polishing abrasive grain dispersion of the invention may contain components other than the composite fine particles of the invention. Examples of such components include various additives to be described below, including an additive for ionic strength adjustment, a polishing accelerator, a surfactant, a hydrophilic compound, a heterocyclic compound, a pH adjuster, and a pH buffer.

The polishing rate is improved when the polishing abrasive grain dispersion of the invention has an ionic strength of not less than 0.007. The upper limit of the ionic strength may be 0.1 and is preferably 0.04.

The ionic strength of the polishing abrasive grain dispersion of the invention means a value calculated from the formula shown below:

$$J = \frac{1}{2}\sum C_i \cdot Z_i^2 \quad \text{[Mathematical Formula 1]}$$

In the formula, J represents the ionic strength; Ci represents the molarity of each ion; and Zi represents the valence of each ion. The molarity of each ion refers to an ion concentration of each substance dissociating at the pH of the polishing abrasive grain dispersion of the substance and is therefore calculated using the acid dissociation constant pKa or the base dissociation constant pKb of the substance. When a salt dissociating into $A^-$ and $B^+$ is added to the polishing abrasive grain dispersion, the acid AH and the base BOH are separately considered to calculate the ion concentrations of $A^-$, $H^+$ and $B^+$, $OH^-$, respectively. An acid to be used for pH adjustment is also calculated in the same manner by separating AH into $A^-$ and $H^+$ and applying the calculation formula shown above.

The polishing abrasive grain dispersion of the invention preferably contains an ionic strength adjuster. The ionic strength adjuster may be added to adjust the ionic strength of the polishing abrasive grain dispersion of the invention to 0.007 or more.

The polishing abrasive grain dispersion of the invention preferably contains one or two ionic strength adjusters selected from the group consisting of ammonium nitrate and ammonium acetate.

The ionic strength adjuster content in the polishing abrasive grain dispersion of the invention is not particularly limited, and is, for instance, preferably 200 to 2,000 ppm and more preferably 300 to 1,500 ppm.

<Polishing Accelerator>

Although the polishing accelerator to be used differs depending on the type of a member to be polished, a conventionally known polishing accelerator can be added to the polishing abrasive grain dispersion of the invention when necessary and used as a polishing slurry. Examples of the polishing accelerator as described above include hydrogen peroxide, peracetic acid, urea peroxide, and a mixture thereof. When an abrasive composition containing the polishing accelerator such as hydrogen peroxide is used, the polishing rate can be effectively improved when a member to be polished is made of metal.

Other examples of the polishing accelerator include inorganic acids such as sulfuric acid, nitric acid, phosphoric acid, oxalic acid, and hydrofluoric acid; an organic acid such as acetic acid; a sodium salt, a potassium salt, an ammonium salt, and an amine salt of these acids; and a mixture thereof.

When polishing a member composed of composite components using the polishing composition containing the polishing accelerator described above, the polishing rate can be accelerated for specific components of the member to be polished to thereby finally obtain a polished flat surface.

When the polishing abrasive grain dispersion of the invention contains a polishing accelerator, the polishing accelerator content is preferably 0.1 to 10 mass %, and more preferably 0.5 to 5 mass %.

<Surfactant and/or Hydrophilic Compound>

A cationic, anionic, nonionic or amphoteric surfactant or a hydrophilic compound can be added to improve the dispersibility and stability of the polishing abrasive grain dispersion of the invention. Both the surfactant and the hydrophilic compound have the effects of reducing the angle of contact with the surface to be polished and accelerating uniform polishing. The surfactant and/or the hydrophilic compound can be, for instance, selected for use from the group shown below:

Examples of the anionic surfactant include carboxylate salts, sulfonate salts, sulfate ester salts, and phosphate ester salts. Exemplary carboxylate salts include soap, N-acylamino acid salts, polyoxyethylene or polyoxypropylene alkyl ether carboxylate salts, and acylated peptides. Exemplary sulfonate salts include alkyl sulfonate salts, alkylbenzene and alkyl naphthalene sulfonate salts, naphthalene sulfonate salts, sulfosuccinate salts, α-olefin sulfonate salts, and N-acyl sulfonate salts. Exemplary sulfate ester salts include sulfated oils, alkyl sulfate salts, alkyl ether sulfate salts, polyoxyethylene or polyoxypropylene alkyl allyl ether sulfate salts, and alkyl amido sulfate salts. Exemplary phosphate ester salts include alkyl phosphate salts and polyoxyethylene or polyoxypropylene alkyl allyl ether phosphate salts.

Examples of the cationic surfactant include aliphatic amine salts, aliphatic quaternary ammonium salts, benzalkonium chloride salts, benzethonium chloride, pyridinium salts, and imidazolinium salts. Examples of the amphoteric surfactant include carboxybetaine surfactants, sulfobetaine surfactants, aminocarboxylate salts, imidazolinium betaines, lecithins, and alkylamine oxides.

Examples of the nonionic surfactant include ether surfactants, ether ester surfactants, ester surfactants, and nitrogen-containing surfactants. Exemplary ether surfactants include polyoxyethylene alkyl and alkylphenyl ethers, alkyl allyl formaldehyde-condensed polyoxyethylene ethers, polyoxyethylene polyoxypropylene block polymers, and polyoxyethylene polyoxypropylene alkyl ethers. Exemplary ether ester surfactants include polyoxyethylene ethers of glycerin esters, polyoxyethylene ethers of sorbitan esters, and polyoxyethylene ethers of sorbitol esters. Exemplary ester surfactants include polyethylene glycol fatty acid esters, glycerin esters, polyglycerin esters, sorbitan esters, propylene glycol esters, and sucrose esters. Exemplary nitrogen-containing surfactants include fatty acid alkanolamides, polyoxyethylene fatty acid amides, and polyoxyethylene alkylamides. Other exemplary surfactants include fluorosurfactants.

Anionic surfactants or nonionic surfactants are preferred surfactants. Exemplary salts include ammonium salts, potassium salts and sodium salts, and ammonium salts and potassium salts are particularly preferred.

Furthermore, other exemplary surfactants and hydrophilic polymers include esters such as glycerin ester, sorbitan ester, and alanin ethyl ester; ethers such as polyethylene glycol, polypropylene glycol, polytetramethylene glycol, polyethylene glycol alkyl ether, polyethylene glycol alkenyl ether, alkyl polyethylene glycol, alkyl polyethylene glycol alkyl ether, alkyl polyethylene glycol alkenyl ether, alkenyl polyethylene glycol, alkenyl polyethylene glycol alkyl ether, alkenyl polyethylene glycol alkenyl ether, polypropylene glycol alkyl ether, polypropylene glycol alkenyl ether, alkyl polypropylene glycol, alkyl polypropylene glycol alkyl ether, alkyl polypropylene glycol alkenyl ether, and alkenyl polypropylene glycol; polysaccharides such as alginic acid, pectic acid, carboxymethyl cellulose, curdlan, and pullulan; amino acid salts such as glycine ammonium salt and glycine sodium salt; polycarboxylic acids and their salts such as polyaspartic acid, polyglutamic acid, polylysine, polymalic acid, polymethacrylic acid, poly(ammonium methacrylate), poly(sodium methacrylate), polyamide acid, polymaleic acid, polyitaconic acid, polyfumaric acid, poly(p-styrene carboxylic acid), polyacrylic acid, polyacrylamide, aminopolyacrylamide, poly(ammonium acrylate), poly(sodium acrylate), polyamide acid, ammonium salt of polyamide acid, sodium salt of polyamide acid, and polyglyoxylic acid; vinyl polymers such as polyvinyl alcohol, polyvinylpyrrolidone, and polyacrolein; sulfonic acid and its salts such as ammonium methyl taurate, sodium methyl taurate, sodium methyl sulfate, ammonium ethyl sulfate, ammonium butyl sulfate, sodium vinyl sulfonate, sodium 1-allyl sulfonate, sodium 2-allyl sulfonate, sodium methoxymethyl sulfonate, ammonium ethoxymethyl sulfonate, and sodium 3-ethoxypropyl sulfonate; and amides such as propionamide, acrylamide, methylurea, nicotinamide, succinic amide, and sulfanilamide.

When a substrate to be applied for polishing is a glass substrate, any surfactant may be advantageously used. However, when an effect of contamination with an alkali metal, an alkaline-earth metal or a halide is to be avoided in a silicon substrate for a semiconductor integrated circuit or the like, a surfactant of an acid or its ammonium salt is desirably used.

When the polishing abrasive grain dispersion of the invention contains a surfactant and/or a hydrophilic compound, the surfactant and the hydrophilic compound are preferably contained in a total amount of 0.001 to 10 g, more preferably 0.01 to 5 g, and particularly preferably 0.1 to 3 g per L of the polishing abrasive grain dispersion.

The surfactant and/or the hydrophilic compound is contained in an amount of preferably not less than 0.001 g per L of the polishing abrasive grain dispersion in order to obtain advantageous effects, and in an amount of preferably not more than 10 g per L of the polishing abrasive grain dispersion in order to prevent reduction of the polishing rate.

The surfactants or the hydrophilic compounds may be used alone or in combination of two or more, and different types of surfactants or hydrophilic compounds may be used in combination.

<Heterocyclic Compound>

When metal is included in the substrate to be polished, to which the polishing abrasive grain dispersion of the invention is applied, a heterocyclic compound may be contained in the polishing abrasive grain dispersion of the invention to suppress erosion of the substrate to be polished through formation of a passive layer or a dissolution inhibiting layer on the metal. The heterocyclic compound is a compound having a heterocycle containing at least one heteroatom. The heteroatom refers to an atom other than carbon atom and hydrogen atom. The heterocycle refers to a cyclic compound having at least one heteroatom. The heteroatom only refers to an atom that forms a constituent portion of a ring system of a heterocycle, and does not refer to an atom that is positioned outside the ring system, or is separated from the ring system by at least one non-conjugated single bond, or forms a part of a further substituent of the ring system. Preferred examples of the heteroatom include, but are not limited to, nitrogen atom, sulfur atom, oxygen atom, selenium atom, tellurium atom, phosphorus atom, silicon atom, and boron atom. Examples of the heterocyclic compound that may be used include imidazole, benzotriazole, benzothiazole, and tetrazole. More specific examples of the heterocyclic compound include, but are not limited to, 1,2,3,4-tetrazole, 5-amino-1,2,3,4-tetrazole, 5-methyl-1,2,3,4-tetrazole, 1,2,3-triazole, 4-amino-1,2,3-triazole, 4,5-diamino-1,2,3-triazole, 1,2,4-triazole, 3-amino-1,2,4-triazole, and 3,5-diamino-1,2,4-triazole.

When the polishing abrasive grain dispersion of the invention contains the heterocyclic compound, the heterocyclic compound content is preferably 0.001 to 1.0 mass %, more preferably 0.001 to 0.7 mass %, and even more preferably 0.002 to 0.4 mass %.

<pH Adjuster>

An acid or a base can be optionally added to enhance the effects of the above-described additives, thereby adjusting the pH of the polishing composition.

When the polishing abrasive grain dispersion of the invention is adjusted to a pH of 7 or more, an alkaline pH adjuster is used. Sodium hydroxide, ammonia water, ammonium carbonate, and amines such as ethylamine, methylamine, triethylamine, and tetramethylamine are desirably used.

When the polishing abrasive grain dispersion of the invention is adjusted to a pH of less than 7, an acidic pH adjuster is used. For example, hydroxy acids such as acetic acid, lactic acid, citric acid, malic acid, tartaric acid, and glyceric acid, and mineral acids such as hydrochloric acid and nitric acid are used.

<pH Buffer>

The pH buffer may be used to keep the pH of the polishing abrasive grain dispersion of the invention at a constant value. Examples of the pH buffer that may be used include phosphates and borates such as ammonium dihydrogen phosphate, diammonium hydrogen phosphate, and ammonium tetraborate tetrahydrate, and organic acids.

An organic solvent can be used as the dispersion solvent in the polishing abrasive grain dispersion of the invention, examples thereof including alcohols such as methanol, ethanol, isopropanol, n-butanol, and methyl isobutyl carbinol; ketones such as acetone, 2-butanone, ethyl amyl ketone, diacetone alcohol, isophorone, and cyclohexanone; amides such as N, N-dimethylformamide, and N,N-dimethylacetamide; ethers such as diethyl ether, isopropyl ether, tetrahydrofuran, 1,4-dioxane, and 3,4-dihydro-2H-pyran; glycol ethers such as 2-methoxyethanol, 2-ethoxyethanol, 2-butoxyethanol, and ethylene glycol dimethyl ether; glycol ether acetates such as 2-methoxyethyl acetate, 2-ethoxyethyl acetate, and 2-butoxyethyl acetate; esters such as methyl acetate, ethyl acetate, isobutyl acetate, amyl acetate, ethyl lactate, and ethylene carbonate; aromatic hydrocarbons such as benzene, toluene and xylene; aliphatic hydrocarbons such as hexane, heptane, isooctane, and cyclohexane; halogenated hydrocarbons such as methylene chloride, 1,2-dichloroethane, dichloropropane, and chlorobenzene; sulfoxides such as dimethyl sulfoxide; pyrrolidones such as N-methyl-2-pyrrolidone, and N-octyl-2-pyrrolidone. These may be mixed with water for use.

The solids concentration in the polishing abrasive grain dispersion of the invention is preferably in the range of 0.3 to 50 mass %. When the solids concentration is too low, the polishing rate may be reduced. Even when the solids concentration is too high to the contrary, the polishing rate is scarcely further increased, which may be uneconomical.

EXAMPLES

The present invention is described below by way of examples. The present invention should not be construed as being limited to these examples.
<Experiment 1>
Each measuring method and a testing method in Examples and Comparative Examples are first described in detail. Measurement results and testing results in Examples and Comparative Examples are shown in Table 1.
[Component Analysis]
[Silica Fine Particles (Mother Particles)]
When the silica fine particles were made from a sodium silicate material, the $SiO_2$ weight in the silica fine particle dispersion to be described later was determined by weighing after loss on ignition at 1,000° C. When the silica fine particles were made from an alkoxysilane material, the $SiO_2$ weight was determined by weighing after drying the silica fine particle dispersion at 150° C. for 1 hour.
[Silica-Based Composite Fine Particles]
The element contents are measured by the method described below.
About 1 g (solids content: 20 mass %) of a sample made of a silica-based composite fine particle dispersion is first placed in a platinum dish. Phosphoric acid (3 mL), nitric acid (5 mL) and hydrofluoric acid (10 mL) are added and heated on a sand bath. When dried, the sample is dissolved by addition of a small amount of water and nitric acid (50 mL) and is then placed in a 100 mL volumetric flask and the volume is adjusted to 100 mL by addition of water. Na and K in this solution are measured by an atomic absorption spectrometer (e.g., Z-2310 manufactured by Hitachi, Ltd.).

Next, a portion (10 mL) of the solution placed in the 100 mL volumetric flask is placed in a 20 mL volumetric flask. This operation is repeated five times to obtain five 10 mL portions. The five portions are used to make measurement of Al, Ag, Ca, Cr, Cu, Fe, Mg, Ni, Ti, Zn, Zr, U, and Th by a standard addition method by means of an ICP plasma emission spectrometer (e.g., SPS5520 manufactured by SII). A blank value is also measured by the same method and a measured value of each element is obtained by adjusting through subtraction of the blank value.

Unless otherwise specified, the amounts of the components such as Na, Al, Ag, Ca, Cr, Cu, Fe, K, Mg, Ni, Ti, Zn, Zr, U, and Th contained in the invention (component contents) refer to values obtained through measurement using the method described above.

The anion contents are measured by the method described below.
<Cl>
Acetone is added to 20 g (solids content: 20 mass %) of a sample made of a silica-based composite fine particle dispersion to adjust the volume to 100 mL, and to the solution are added acetic acid (5 mL) and a 0.001 mol sodium chloride solution (4 mL). The mixture is analyzed with a 0.002 mol silver nitrate solution by potentiometric titration (potentiometric titrator AT-610 manufactured by Kyoto Electronics Manufacturing Co., Ltd.).

Separately as blank measurement, acetic acid (5 mL) and a 0.001 mol sodium chloride solution (4 mL) are added to acetone (100 mL) and titration is performed with a 0.002 mol silver nitrate solution. The titer in this titration is determined and is subtracted from the titer in the case of using the sample to obtain the titer of the sample.

<$NO_3$, $SO_4$, F>
A sample (5 g; solids content: 20 mass %) made of a silica-based composite fine particle dispersion is diluted with water. A dilution is placed in a 100 mL volumetric flask. The volumetric flask is placed in a 50 mL centrifuge tube. The dilution is centrifuged at 4,000 rpm for 20 minutes by a centrifuge (HIMAC CT06E manufactured by Hitachi, Ltd.), and a solution obtained by removing the precipitated components is analyzed by ion chromatography (ICS-1100 manufactured by DIONEX).
<$SiO_2$, $CeO_2$>
When determining the silica content and the ceria content in silica-based composite fine particles, the solids concentration in a silica-based composite fine particle dispersion is first determined by weighing after loss on ignition at 1,000° C. Next, measurement of Ce is performed by the standard addition method using an ICP plasma emission spectrometer (e.g., SPS5520 manufactured by SII) in the same manner as in Al to Th, and $CeO_2$ mass % is calculated from the resulting Ce content. Then, $SiO_2$ mass % is calculated assuming here that the component other than $CeO_2$ in the composite fine particles of the invention is $SiO_2$.

The element contents and the anion contents in silica fine particles (mother particles) were determined by replacing the silica-based composite fine particle dispersion used as the sample by a silica fine particle dispersion in the analysis method of the silica-based composite fine particles.

[X-Ray Diffractometry, Measurement of Crystallite Size]
The silica-based composite fine particle dispersion obtained in each of Examples and Comparative Examples was dried with a conventionally known drier according to the above-described method, and the resulting powder was pulverized with a mortar for 10 minutes and an X-ray diffraction pattern was obtained by an X-ray diffractometer (e.g., RINT 1400 manufactured by Rigaku Corporation) to thereby specify the crystal type.

As described above, the full width at half maximum of a peak of a (111) plane (2θ=around 28θ) in the resulting X-ray diffraction pattern when 2θ=around 28θ was measured and the crystallite size was determined by the Scherrer equation.

<Average Particle Size>
The average particle size of the particles contained in the silica fine particle dispersions and the silica-based composite fine particle dispersions obtained in Examples and Comparative Examples was measured by the method described above. More specifically, PAR-III manufactured by Otsuka Electronics Co., Ltd. was used for the silica fine particle dispersion, and a device LA950 manufactured by HORIBA, Ltd. was used for the silica-based composite fine particle dispersion.

Measurement conditions of PAR-III are as follows:
Previously prepared ammonia water having a concentration of 0.56 mass % was added to the silica fine particle dispersion to adjust the solids concentration to 1.0 mass % and the mixture was filled into a plastic measurement cell. During measurement, the quantity of light was adjusted with a pinhole selector and an attenuator filter so as to have a scattering intensity of 8,000 to 12,000, and the refractive index of the solvent was measured using the value of water.

Measurement conditions of LA-950 are as follows:
LA-950V2 version: 7.02; algorithm option: standard operation; refractive index of solid: 1.450; refractive index of solvent (pure water): 1.333; number of repetitions: 15; circulation speed of sample introducing bath: 5; stirring speed: 2.

A measurement sequence including the previous settings was used to make measurement. Then, a measurement sample in the form of a stock solution was introduced with a dropper into a sample feed inlet of the device. The measurement sample was introduced so that the transmittance (R) had a numerical value of 90%. After the numerical value of the transmittance (R) was stabilized, the measurement sample was exposed to ultrasonic irradiation for 5 minutes to measure the particle size.

<Ratio Between Shorter Diameter and Longer Diameter>

In projection images obtained by shooting particles contained in the silica fine particle dispersions and the silica-based composite fine particle dispersions obtained in Examples and Comparative Examples with a transmission electron microscope (type S-5500 manufactured by Hitachi, Ltd.) at a magnification of 250,000× (or 500,000×), the maximum diameter of a particle was deemed as the major axis and its length was measured and the measured value was taken as a longer diameter (DL). A point dividing the major axis length on the major axis into two halves was determined. Two points of intersection of a line orthogonal to the major axis at the point with the periphery of the particle were determined, and the distance between the two points was measured and taken as a shorter diameter (DS). Then, the ratio (DS/DL) was determined. Arbitrary 50 particles were subjected to the measurement to determine the percentage (%) of the number of particles as single particles having a ratio between the shorter diameter and the longer diameter of not more than 0.8.

[Method of Polishing Test]
<Polishing of $SiO_2$ Film>

The dispersion (polishing abrasive grain dispersion) containing the silica-based composite fine particle dispersion obtained in each of Examples and Comparative Examples was prepared. The solids concentration was 0.6 mass %, and nitric acid was added to adjust the pH to 5.0.

Next, a substrate of an $SiO_2$ insulating film (thickness: 1 μm) made by a thermal oxidation technique was prepared as a substrate to be polished.

Next, the substrate to be polished was set on a polishing device (NF300 manufactured by Nano Factor Co., Ltd.) and polished by using a polishing pad (concentric circle type IC-1000/SUBA400 manufactured by Nitta Haas Incorporated) and supplying the polishing abrasive grain dispersion for 1 minute at a rate of 50 mL/min under a substrate load of 0.5 MPa and at a table rotation speed of 90 rpm.

Then, a weight change of the substrate to be polished between before and after polishing was determined to calculate the polishing rate.

The smoothness (surface roughness Ra) of a surface of the polished substrate was measured using an atomic force microscope (AFM manufactured by Hitachi High-Technologies Corporation).

As for the observation of scratches due to polishing, five substrate samples were polished and insulating film surfaces were observed with an optical microscope. Evaluation criteria are as follows:
As a result of observation of five substrate samples, there were so many linear scratches that their number could not be visually counted . . . . "Innumerable"
As a result of observation of five substrate samples, linear scratches were seen in at least one substrate sample . . . . "Present"
As a result of observation of five substrate samples, linear scratches were not seen . . . . "Not seen definitely"

<Polishing of Aluminum Hard Disk>

The dispersion (polishing abrasive grain dispersion) containing the silica-based composite fine particle dispersion obtained in each of Examples and Comparative Examples was prepared. The solids concentration was 9 mass %, and nitric acid was added to adjust the pH to 2.0.

A substrate for an aluminum hard disk was set on a polishing device (NF300 manufactured by Nano Factor Co., Ltd.), and polished by using a polishing pad (Polytex 012 manufactured by Nitta Haas Incorporated) and supplying the polishing abrasive grain dispersion for 5 minutes at a rate of 20 mL/min under a substrate load of 0.05 MPa and at a table rotation speed of 30 rpm. Its whole surface was observed by an ultrafine defect visualizing macro inspection system (trade name: Maicro-Max manufactured by Vision Psytec) after adjustment to an enlargement level of Zoom 15 with an adjustment ring. The number of scratches (linear scratches) present at a polished substrate surface corresponding to 65.97 $cm^2$ was counted, and the substrate was evaluated according to the criteria shown below:

| Number of linear scratches | Evaluation |
| --- | --- |
| Less than 50 | "Few" |
| Not less than 50 but less than 80 | "A few" |
| Not less than 80 | "Many" |
| At least 80 and the total number is so large that counting cannot be made | "*" |

<Preparation Step 1>
Preparation of <<High-Purity Silicate Solution>>

An aqueous sodium silicate solution having an $SiO_2$ concentration of 24.06 mass % and an $Na_2O$ concentration of 7.97 mass % was prepared. Pure water was added to the aqueous sodium silicate solution so that the $SiO_2$ concentration became 5.0 mass %.

[Acidic Silicate Solution]

The resulting 5.0 mass % aqueous sodium silicate solution (18 kg) was passed through a strong acid cation exchange resin (6 L; SK1BH manufactured by Mitsubishi Chemical Corporation) at a space velocity of 3.0 $h^{-1}$ to obtain an acidic silicate solution (18 kg) having a pH of 2.7.

The resulting acidic silicate solution had an $SiO_2$ concentration of 4.7 mass %.

[High-Purity Silicate Solution]

Next, the acidic silicate solution was passed through a strong acid cation exchange resin (SK1BH manufactured by Mitsubishi Chemical Corporation) at a space velocity of 3.0 $h^{-1}$ to obtain a high-purity silicate solution having a pH of 2.7. The resulting high-purity silicate solution had an $SiO_2$ concentration of 4.4 mass %.

Preparation of <<Silica Fine Particle Dispersion (Average Particle Size of Silica Fine Particles: 25 nm)>>

The high-purity silicate solution (514.5 g) was added to pure water (42 g) with stirring, and then 15% ammonia water (1,584.6 g) was further added. After that, the temperature was increased to 83° C. and held for 30 minutes.

Next, the high-purity silicate solution (13,700 g) was further added over 18 hours. After the end of addition, the solution was aged at a temperature held at 83° C. to obtain a 25 nm silica fine particle dispersion.

The resulting silica fine particle dispersion was cooled to 40° C. and concentrated to an $SiO_2$ concentration of 12 mass % using an ultrafiltration membrane (SIP1013 manufactured by Asahi Kasei Corporation).

Preparation of <<Silica Fine Particle Dispersion (Average Particle Size of Silica Fine Particles: 45 nm)>>

The 12 mass % 25 nm silica fine particle dispersion (963 g) was added to pure water (991 g) with stirring. Then, 15% ammonia water (1,414 g) was further added. Then, the temperature was increased to 87° C. and held for 30 minutes.

Next, the high-purity silicate solution (12,812 g) was further added over 18 hours. After the end of addition, the solution was aged at a temperature held at 87° C. to obtain a 45 nm silica fine particle dispersion.

The resulting silica fine particle dispersion was cooled to 40° C. and concentrated to an $SiO_2$ concentration of 12 mass % using an ultrafiltration membrane (SIP1013 manufactured by Asahi Kasei Corporation).

Preparation of <<Silica Fine Particle Dispersion (Average Particle Size of Silica Fine Particles: 70 nm)>>

The silica fine particle dispersion (705 g; $SiO_2$ concentration: 12 mass %) in which silica fine particles having an average particle size of 45 nm were dispersed in a solvent was prepared, and added to pure water (705 g) with stirring. Then, 15% ammonia water (50 g) was further added. Then, the temperature was increased to 87° C. and held for 30 minutes.

Next, the high-purity silicate solution (7,168 g) was further added over 18 hours. After the end of addition, the solution was aged at a temperature held at 87° C. to obtain a silica fine particle dispersion in which silica fine particles having an average particle size of 70 nm were dispersed in a solvent. The average particle size of the silica fine particles is a value obtained through measurement using dynamic light scattering (dynamic light scattering particle size analyzer: PAR-III).

The resulting silica fine particle dispersion was cooled to 40° C. and concentrated to an $SiO_2$ concentration of 12 mass % using an ultrafiltration membrane (SIP1013 manufactured by Asahi Kasei Corporation).

Preparation of <<Silica Fine Particle Dispersion (Average Particle Size of Silica Fine Particles: 96 nm)>>

The dispersion (1,081 g; $SiO_2$ concentration: 12 mass %) in which silica fine particles having an average particle size of 70 nm were dispersed in a solvent was prepared, and added to pure water (1,081 g) with stirring. Then, 15% ammonia water (50 g) was further added. Then, the temperature was increased to 87° C. and held for 30 minutes.

Next, the high-purity silicate solution (6,143 g) was further added over 18 hours. After the end of addition, the solution was aged at a temperature held at 87° C. to obtain a silica fine particle dispersion in which silica fine particles having an average particle size of 96 nm were dispersed in a solvent. The average particle size of the silica fine particles is a value obtained through measurement using dynamic light scattering (dynamic light scattering particle size analyzer: PAR-III).

The resulting silica fine particle dispersion was cooled to 40° C. and concentrated to an $SiO_2$ concentration of 12 mass % using an ultrafiltration membrane (SIP1013 manufactured by Asahi Kasei Corporation). An anion exchange resin (SANUP B manufactured by Mitsubishi Chemical Corporation) was added to the concentrated silica fine particle dispersion to remove anions.

<Preparation Step 2>

Ultrapure water was added to the 96 nm silica fine particle dispersion obtained in the preparation step 1 to obtain a solution A (6,000 g) having an $SiO_2$ solids concentration of 3 mass %.

Next, ion exchanged water was added to cerium(III) nitrate hexahydrate (4 N high-purity reagent manufactured by Kanto Chemical Co., Inc.) to obtain a solution B having a concentration of 2.5 mass % in terms of $CeO_2$.

Next, the temperature of the solution A (6,000 g) was increased to 50° C. and the solution B (8,453 g, the amount of $CeO_2$ corresponding to 117.4 parts by mass with respect to 100 parts by mass of $SiO_2$) was added to the solution A with stirring over 18 hours. During this operation, the solution was maintained at a temperature of 50° C. and 3% ammonia water was optionally added to maintain the solution at a pH of 7.85.

After the end of addition of the solution B, the temperature of the solution was increased to 93° C. and the solution was aged for 4 hours. After the end of aging, the solution was allowed to stand indoors and to cool to room temperature, and thereafter cleaning was performed until the electric conductivity reached 75 μS/cm while ion exchanged water was supplied through an ultrafiltration membrane. In a precursor particle dispersion A obtained after the end of cleaning, the solids concentration was 7 mass % and the particle size [median diameter] as measured by laser diffraction scattering (LA-950 manufactured by HORIBA, Ltd.) was 4.6 μm.

<Preparation Step 3>

Next, 3 mass % acetic acid was added to the precursor particle dispersion A obtained in the preparation step 2 to adjust the pH to 6.5 and the mixture was dried in a dryer at 120° C. for 15 hours. After that, burning was performed for 2 hours using a muffle furnace at 1,062° C. to obtain a powdery burned body.

To the resulting burned body (100 g) was added ion exchanged water (300 g) and 3% aqueous ammonia solution was further used to adjust the pH to 9.2. After that, wet grinding (batch desktop sand mill manufactured by Kanpe Hapio Co., Ltd.) was performed for 120 minutes using quartz beads (diameter: 0.25 mm; manufactured by Daiken Chemical Co., Ltd.). The grinding was followed by separation of the beads through a 44 mesh wire. The resulting dispersion including a burned and ground body had a solids concentration of 7 mass % and a recovery weight of 1,200 g. During the grinding, an aqueous ammonia solution was added to maintain the pH at 9.2. Next, the resulting dispersion including the burned and ground body was treated at 675G for 3 minutes by a centrifuge (type CR21G manufactured by Hitachi Koki Co., Ltd.) and light liquid (supernatant obtained by removing precipitated components) was collected to obtain a silica-based composite fine particle dispersion. The average particle size (median diameter) in the silica-based composite fine particle dispersion, as measured by laser diffraction scattering (LA-950 manufactured by HORIBA, Ltd.), was 0.208 μm (208 nm).

Example 1

In Example 1, the silica-based composite fine particle dispersion obtained in the preparation step 3 was subjected to a second process of grinding and centrifugation. The method is described below. The silica-based composite fine particle dispersion obtained by the second process of grinding and centrifugation also obviously corresponds to the dispersion of the invention.

To the silica-based composite fine particle dispersion obtained in the preparation step 3 was added ion exchanged water to prepare a solution (1 kg) having a solids concentration adjusted to 20 mass %. Then, the solution was ground using a grinder (LMZ-06 manufactured by Ashizawa Finetech Ltd.). Quartz beads (diameter: 0.25 mm) was used to perform grinding for 80 minutes by circulating under a condition of 1 L/min at a filling factor of 85% and a circumferential velocity of 10 m/s. The concentration during the grinding was 10 mass % because ion exchanged water remained in the grinding chamber and piping of the grinder. During the grinding, 3% ammonia was added to maintain the pH at 9.2. Solids were collected by washing the grinding chamber with water after the grinding and the solids content was 9.3 mass %.

Then, the dispersion after the grinding was treated at a relative centrifugal acceleration of 1,700 G for 102 seconds by a centrifuge (type CR21G manufactured by Hitachi Koki Co., Ltd.). Then, light liquid was collected to obtain a silica-based composite fine particle dispersion. The average particle size (median diameter) in the resulting silica-based composite fine particle dispersion, as measured by laser diffraction scattering (LA-950 manufactured by HORIBA, Ltd.), was 0.196 μm (196 nm).

The silica-based composite fine particles contained in the resulting silica-based composite fine particle dispersion were subjected to measurement using X-ray diffractometry and a Cerianite diffraction pattern was seen.

Next, the silica-based composite fine particle dispersion was used to perform a polishing test. The ratio between the shorter diameter and the longer diameter in the silica-based composite fine particles contained in the polishing abrasive grain dispersion was measured.

The average particle size of the silica fine particles contained in the silica fine particle dispersion used as a material, the impurity content in the silica fine particles, the ratio of the parts by mass of ceria to 100 parts by mass of silica in the silica-based composite fine particles, the burning temperature during preparation of the silica-based composite fine particles, the crystallite size of the silica-based composite fine particles, the crystal type, the impurity contents in the silica-based composite fine particles, the average particle size of the silica-based composite fine particles, the percentage of the number of particles having a ratio between the shorter diameter and the longer diameter of not more than 0.8 in the silica-based composite fine particles and measurement results of the polishing performance (polishing rate, surface roughness, observation results of polishing scratches in polishing of the $SiO_2$ film, and number of scratches in polishing of the aluminum hard disk) are shown in Table 1 to Table 3. The same applies to Examples and Comparative Examples that follow.

Example 2

In Example 2, the silica-based composite fine particle dispersion obtained in the preparation step 3 was subjected to a second process of grinding and centrifugation. The method is described below. The silica-based composite fine particle dispersion obtained by the second process of grinding and centrifugation also obviously corresponds to the dispersion of the invention.

To the silica-based composite fine particle dispersion obtained in the preparation step 3 was added ion exchanged water to adjust the solids concentration to 5 mass %. Then, centrifugation was performed by passing the dispersion under conditions of a relative centrifugal acceleration of 10,000 G and a liquid passing rate of 1 L/min using a 4 L rotor in a high-speed centrifuge H-660 manufactured by Kokusan Co., Ltd. The silica fine particle dispersion obtained after centrifugation had a solids concentration of 1.8% and an average particle size [median diameter], as measured by laser diffraction scattering, of 0.200 μm (200 nm).

Example 3

The precursor particle dispersion A (4.0 kg) obtained in the preparation step 2 was prepared. Then, the dispersion was ground using a grinder (LMZ-06 manufactured by Ashizawa Finetech Ltd.). Quartz beads (diameter: 0.25 mm) was used to perform grinding by 20 passes under a condition of 2 L/min at a filling factor of 60% and a circumferential velocity of 8 m/s. During the grinding of the precursor particle dispersion A, ammonia water and the like were not added thereto. The precursor fine particle dispersion A after the grinding had a pH of 9.0. The average particle size (median diameter) in the precursor fine particle dispersion A after the grinding, as measured by laser diffraction scattering (LA-950 manufactured by HORIBA, Ltd.), was 0.225 μm.

Next, 3 mass % acetic acid was added to the precursor fine particle dispersion A after the grinding to adjust the pH to 6.5 and the mixture was dried in a dryer at 120° C. for 15 hours. After that, burning was performed for 2 hours using a muffle furnace at 1,062° C. to obtain a powdery burned body.

To the resulting burned body (100 g) was added ion exchanged water (300 g) and 3% aqueous ammonia solution was further used to adjust the pH to 9.2. After that, wet grinding (batch desktop sand mill manufactured by Kanpe Hapio Co., Ltd.) was performed for 60 minutes. Quartz beads (diameter: 0.25 mm; manufactured by Daiken Chemical Co., Ltd.) were used in the grinding. During the grinding, an aqueous ammonia solution was added to maintain the pH at 9.2. A dispersion (1,020 g) including a burned and ground body and having a solids concentration of 2.4 mass % was thus obtained.

The dispersion including the burned and ground body was treated at a relative centrifugal acceleration of 1,700 G for 102 seconds by a centrifuge (type CR21G manufactured by Hitachi Koki Co., Ltd.), and light liquid was collected to obtain a silica-based composite fine particle dispersion. The average particle size (median diameter) in the resulting silica-based composite fine particle dispersion, as measured by laser diffraction scattering (LA-950 manufactured by HORIBA, Ltd.), was 0.198 μm (198 nm).

Example 4

Ultrapure water was added to the silica fine particle dispersion obtained in the preparation step 1 to obtain a solution A (6,000 g) having an $SiO_2$ solids concentration of 3 mass %.

Next, ion exchanged water was added to cerium(III) nitrate hexahydrate (4 N high-purity reagent manufactured by Kanto Chemical Co., Inc.) to obtain a solution B having a concentration of 2.5 mass % in terms of $CeO_2$.

Next, the solution A (6,000 g; dry weight: 180 g) was maintained at 18° C. and the solution B (8,453 g; dry weight: 211.3 g) was added to the stirring solution A over 18 hours. During this operation, the solution was maintained at a temperature of 18° C. and 3% ammonia water was optionally added to maintain the solution at a pH of 7.7. After the end of addition, the solution was aged at a solution temperature of 18° C. for 4 hours. Then, cleaning was performed by supplying ion exchanged water through an ultrafiltration membrane. The precursor particle dispersion obtained after the end of cleaning had a solids concentration of 4.3 mass %, a pH of 4.3 (at 25° C.) and an electric conductivity of 170 μs/cm (at 25° C.).

Next, the resulting precursor particle dispersion was dried in a dryer at 120° C. for 16 hours. After that, burning was performed for 2 hours using a muffle furnace at 1,030° C. to obtain a powdery burned body.

To the resulting burned body (100 g) was added ion exchanged water (300 g) and 3% aqueous ammonia solution was further added to adjust the pH to 9.2. After that, wet grinding (batch desktop sand mill manufactured by Kanpe Hapio Co., Ltd.) was performed for 90 minutes. Quartz beads (diameter: 0.25 mm; manufactured by Daiken Chemical Co., Ltd.) were used in the grinding. The grinding was followed by separation of the beads through a 44 mesh wire. During the grinding, an aqueous ammonia solution was added to maintain the pH at 9.2. A dispersion (1,115 g) including a burned and ground body and having a solids concentration of 3.1 mass % was thus obtained.

The dispersion including the burned and ground body was treated at a relative centrifugal acceleration of 1,700 G for 102 seconds by a centrifuge (type CR21G manufactured by Hitachi Koki Co., Ltd.), and light liquid was collected to obtain a silica-based composite fine particle dispersion. The average particle size (median diameter) in the resulting silica-based composite fine particle dispersion, as measured by laser diffraction scattering (LA-950 manufactured by HORIBA, Ltd.), was 0.194 μm (194 nm).

The silica-based composite fine particles contained in the silica-based composite fine particle dispersion obtained in Example 4 was observed using SEM and TEM. An SEM image and a TEM image (at 50,000×) are shown in FIG. 1(a) and FIG. 1(b), respectively.

Figure 2:
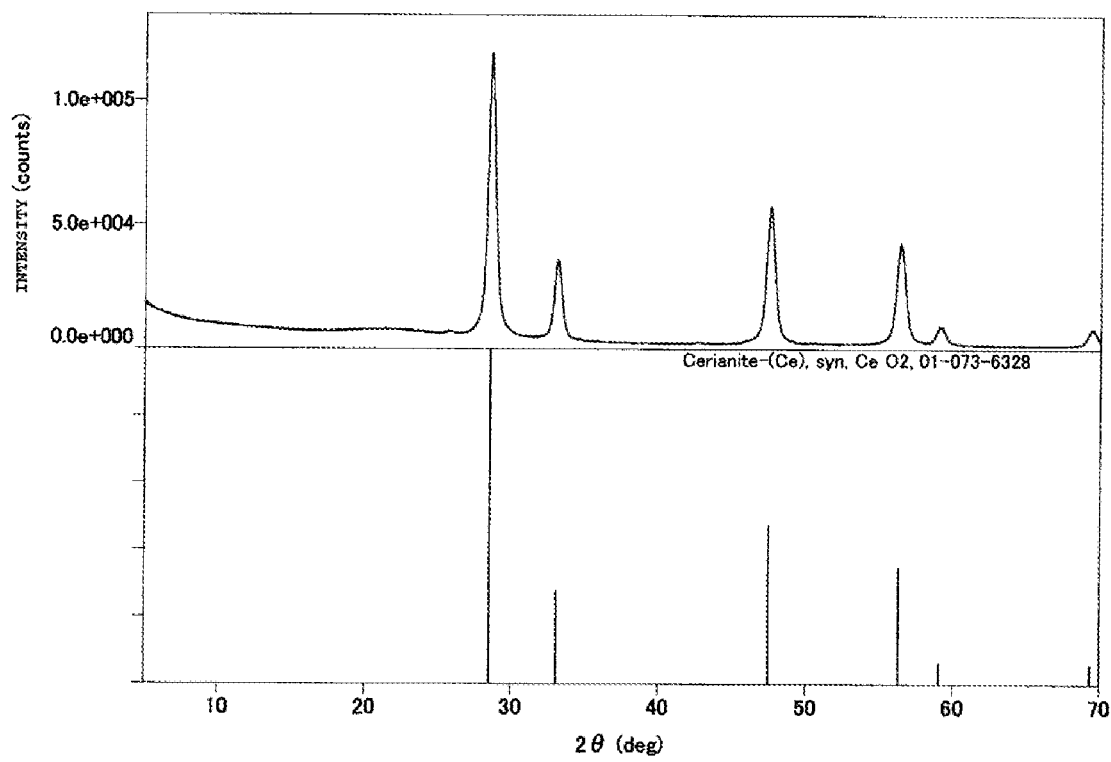
FIG. 2 is an X-ray diffraction pattern obtained in Example 4.
Figure 3:
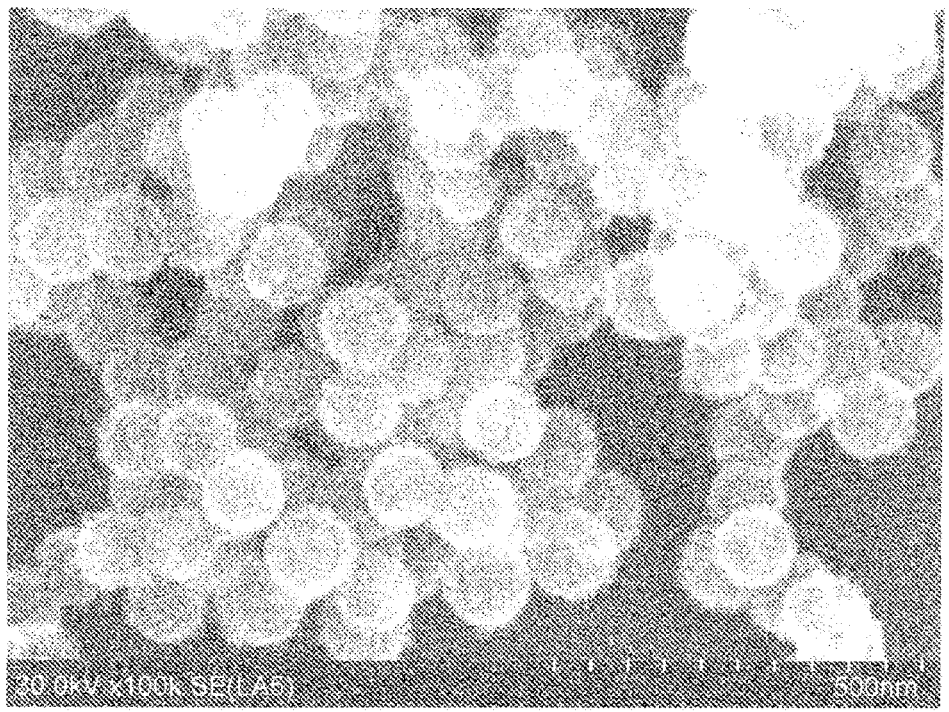
FIG. 3(a) is an SEM image obtained in Comparative Example 2.
FIG. 3(b) is a TEM image obtained in Comparative Example 2.
Figure 3:
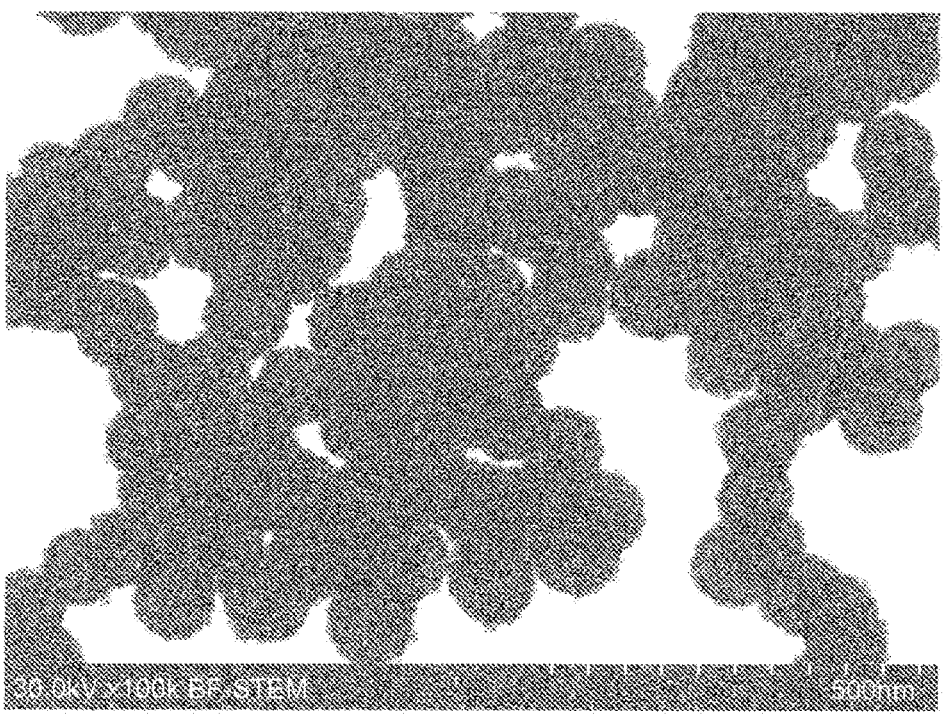

Further, an X-ray diffraction pattern of the silica-based composite fine particles contained in the silica-based composite fine particle dispersion obtained in Example 4 is shown in FIG. 2.

The X-ray diffraction pattern in FIG. 2 shows rather sharp Cerianite crystals, and it seems from the TEM and SEM images that ceria crystal particles are strongly sintered with the silica surfaces.

It was observed from FIG. 1 that a thin silica coating is present so as to cover the uppermost surfaces of the silica-based composite fine particles.

Example 5

Ion exchanged water was added to the silica fine particle dispersion obtained in the preparation step 1 to obtain a solution A (6,000 g) having an $SiO_2$ solids concentration of 3 mass %.

Next, ion exchanged water was added to cerium(III) nitrate hexahydrate (4 N high-purity reagent manufactured by Kanto Chemical Co., Inc.) to obtain a solution B having a concentration of 2.5 mass % in terms of $CeO_2$.

Next, the temperature of the solution A (6,000 g) was increased to 50° C. and the solution B (8,453 g, the amount of $CeO_2$ corresponding to 117.4 parts by mass with respect to 100 parts by mass of $SiO_2$) was added to the solution A with stirring over 18 hours. During this operation, the solution was maintained at a temperature of 50° C. and 3% ammonia water was optionally added to maintain the solution at a pH of 7.85.

After the end of addition of the solution B, the temperature of the solution was increased to 93° C. and the solution was aged for 4 hours. After the end of aging, the solution was allowed to stand indoors and to cool to room temperature, and thereafter cleaning was performed until the electric conductivity reached 75 uS/cm while ion exchanged water was supplied through an ultrafiltration membrane. In a precursor particle dispersion obtained after the end of cleaning, the solids concentration was 7 mass %, and the particle size as measured by laser diffraction scattering (LA-950 manufactured by HORIBA, Ltd.) at a pH of 9.1 (at 25° C.) was 4.6 μm.

Next, 3 mass % aqueous acetic acid solution was added to the resulting precursor particle dispersion to adjust the pH to 6.5 and the mixture was dried in a dryer at 120° C. for 15 hours. After that, burning was performed for 2 hours using a muffle furnace at 1,062° C. to obtain a powdery burned body.

The resulting burned body (310 g) and ion exchanged water (430 g) were placed in a 1 L handle beaker and 3% aqueous ammonia solution was added. The mixture was exposed to ultrasonic irradiation with stirring for 10 minutes in an ultrasonic bath to obtain a suspension having a pH of 10 (temperature: 25° C.).

Next, quartz beads (595 g) having a diameter of 0.25 mm were introduced into a grinder (LMZ06 manufactured by Ashizawa Finetech Ltd.) that had previously been subjected to equipment cleaning, thereby performing a water operation. The above-described suspension was further charged into a charge tank of the grinder (filling factor: 85%). The concentration during the grinding is 25 mass % in consideration of the ion exchanged water remaining in the grinding chamber and piping of the grinder. Then, wet grinding was performed under conditions of a disk circumferential velocity in the grinder of 12 m/s, a number of passes of 25, and a retention time per pass of 0.43 minute. For each path, 3% aqueous ammonia solution was added so as to maintain the suspension during the grinding at a pH of 10. A dispersion including a burned and ground body and having a solids concentration of 22 mass % was thus obtained.

Next, the resulting dispersion including the burned and ground body was centrifuged at a relative centrifugal acceleration of 675G for 3 minutes by a centrifuge (type CR21G manufactured by Hitachi Koki Co., Ltd.) and precipitated components were removed to obtain a silica-based composite fine particle dispersion. The average particle size (median diameter) in the resulting silica-based composite fine particle dispersion, as measured by laser diffraction scattering (LA-950 manufactured by HORIBA, Ltd.), was 0.208 μm (208 nm).

Example 6

Ion exchanged water was added to the silica fine particle dispersion obtained in the process of the preparation step 1 and having an average particle size of 70 nm to obtain a solution A (6,000 g) having an $SiO_2$ solids concentration of 3.0 mass %.

Next, ion exchanged water was added to cerium(III) nitrate hexahydrate to obtain a solution B having a concentration of 3.0 mass % in terms of $CeO_2$.

Next, the solution A (6,000 g; dry weight: 180 g) was cooled to 15.5° C. and the solution B (7,044.2 g; dry weight: 211.3 g) was added to the stirring solution A over 18 hours. During this operation, the solution was maintained at a temperature of 15.5° C. and 3.0 mass % ammonia water was optionally added to maintain the solution at a pH of 8.3 to 8.6. After the end of addition of the solution B, the solution was aged for 4 hours while maintaining the solution at a temperature of 15.5° C. During addition of the solution B to the solution A and aging, air blowing into the solution mixture was continued and the oxidation-reduction potential was kept at 100 to 200 mV.

After the end of aging, an operation including filtration using an ultrafiltration membrane and its subsequent cleaning with supplied ion exchanged water was repeatedly performed until the electric conductivity reached 26 μS/cm, thereby obtaining a precursor particle dispersion. Next, 3.0 mass % acetic acid was added to the resulting precursor particle dispersion to adjust the pH to 6.5 and the mixture was dried in a dryer at 120° C. for 15 hours. After that, burning was performed for 2 hours using a muffle furnace at 1,064° C. to obtain a powdery burned body.

To the resulting burned body (100 g) was added ion exchanged water (300 g) and 3.0 mass % aqueous ammonia solution was further added to adjust the pH to 10.0. After that, wet grinding (batch desktop sand mill manufactured by Kanpe Hapio Co., Ltd.) was performed for 270 minutes. Quartz beads (diameter: 0.25 mm) were used in the grinding. Then, the grinding was followed by separation of the beads through a 44 mesh wire. During the grinding, an aqueous ammonia solution was added to maintain the pH at 10.0. A dispersion (1,151 g) including a burned and ground body and having a solids concentration of 6.6 mass % was thus obtained.

The dispersion including the burned and ground body was further treated at a relative centrifugal acceleration of 1,700 G for 102 seconds by a centrifuge (type CR21G manufactured by Hitachi Koki Co., Ltd.), and light liquid (supernatant obtained by removing precipitated components) was collected to obtain a silica-based composite fine particle dispersion. Then, the resulting silica-based composite fine particle dispersion was evaluated in the same manner as in Example 1.

Example 7

Ultrapure water was added to the 96 nm silica fine particle dispersion obtained in the preparation step 1 to obtain a solution A (2,500 g) having an $SiO_2$ solids concentration of 3 mass %.

Next, ion exchanged water was added to cerium(III) nitrate hexahydrate (4 N high-purity reagent manufactured by Kanto Chemical Co., Inc.) to obtain a solution B having a concentration of 3.0 mass % in terms of $CeO_2$.

Next, the temperature of the solution A (2,500 g; dry weight: 75 g) was increased to 18° C. and the solution B (5,833.3 g; dry weight: 175 g) was added to the stirring solution A over 18 hours. During this operation, the solution was maintained at a temperature of 18° C. and 3% ammonia water was optionally added to maintain the solution at a pH of 7.8. After the end of addition of the solution B, the solution was aged for 4 hours while maintaining the solution at a temperature of 18° C. During addition of the solution B to the solution A and aging, air blowing into the solution mixture was continued and the oxidation-reduction potential was kept at 100 to 200 mV.

After the end of aging, an operation including filtration using an ultrafiltration membrane and its subsequent cleaning with supplied ion exchanged water was repeatedly performed until the electric conductivity reached 26 µS/cm, thereby obtaining a precursor particle dispersion. The average particle size (median diameter) in the precursor particle dispersion after the end of cleaning, as measured by laser diffraction scattering (LA-950 manufactured by HORIBA, Ltd.), was 0.33 µm.

Next, 3 mass % acetic acid was added to the resulting precursor particle dispersion to adjust the pH to 6.5 and the mixture was dried in a dryer at 120° C. for 15 hours. After that, burning was performed for 2 hours using a muffle furnace at 1,028° C. to obtain a powdery burned body.

To the resulting burned body (100 g) was added ion exchanged water (300 g) and 3.0 mass % aqueous ammonia solution was further added to adjust the pH to 10.0. After that, wet grinding (batch desktop sand mill manufactured by Kanpe Hapio Co., Ltd.) was performed for 120 minutes. Quartz beads (diameter: 0.25 mm) were used in the grinding. Then, the grinding was followed by separation of the beads through a 44 mesh wire. During the grinding, an aqueous ammonia solution was added to maintain the pH at 9.2. A dispersion (1,121 g) including a burned and ground body and having a solids concentration of 7.2 mass % was thus obtained. The dispersion including the burned and ground body was further treated at a relative centrifugal acceleration of 675 G for 3 minutes by a centrifuge (type CR21G manufactured by Hitachi Koki Co., Ltd.), and light liquid (supernatant obtained by removing precipitated components) was collected to obtain a silica-based composite fine particle dispersion. Then, the resulting silica-based composite fine particle dispersion was evaluated in the same manner as in Example 1.

Comparative Example 1

The 96 nm silica fine particle dispersion obtained in the preparation step 1 was subjected to measurement of the average particle size and the like.

Comparative Example 2

The precursor particle dispersion A obtained in the preparation step 2 was subjected to measurement of the average particle size and the like.

Comparative Example 3

0.7 mass % ammonia water (3.63 kg) was prepared and its temperature was increased to 93° C. (solution A). Then, 1.6 mass % cerium nitrate solution (5.21 kg; solution B) was prepared as $Ceo_2$, and the solution B was added to the solution A over 1 hour. After the end of addition, the solution was aged at a temperature held at 93° C. for 3 hours. The solution after aging had a pH of 8.4. The aged solution was cooled and then centrifuged at a relative centrifugal acceleration of 5,000 G, and the supernatant was removed. Then, ion exchanged water was added to the precipitated cake and the mixture was stirred for reslurrying and centrifuged again at a relative centrifugal acceleration of 5,000 G. This operation was repeated until the slurry had an electric conductivity of not more than 100 µS/cm. The slurry having an electric conductivity of not more than 100 µS/cm was adjusted to a solids concentration of 6.0 mass %, and ultrasonically dispersed to obtain a ceria fine particle dispersion.

The average particle size (median diameter) in the resulting ceria fine particle dispersion, as measured by laser diffraction scattering (LA-950 manufactured by HORIBA, Ltd.), was 0.116 µm.

As a result of measurement of the crystallite size and the crystal type with X-rays, the crystallite size was 18 nm and a Cerianite crystal type was shown.

The ceria fine particle dispersion was adjusted with nitric acid to a pH of 5.0 to obtain a polishing abrasive grain dispersion having a solids concentration of 0.6 mass %. A thermally oxidized film was polished with the polishing abrasive grain dispersion. The results are shown in Table 1 to Table 3.

Comparative Example 4

Next, 3 mass % acetic acid was added to the precursor particle dispersion A obtained in the preparation step 2 to adjust the pH to 6.5 and the mixture was dried in a dryer at 120° C. for 15 hours. After that, burning was performed for 2 hours using a muffle furnace at 1,250° C. to obtain a powdery burned body.

To the resulting burned body (100 g) was added ion exchanged water (300 g) and 3% aqueous ammonia solution was further used to adjust the pH to 9.2. After that, wet grinding (batch desktop sand mill manufactured by Kanpe Hapio Co., Ltd.) was performed for 120 minutes using quartz beads (diameter: 0.25 mm; manufactured by Daiken Chemical Co., Ltd.). The grinding was followed by separation of the beads through a 44 mesh wire. The resulting dispersion including a burned and ground body had a solids concentration of 7.1 mass % and a recovery weight of 1,183 g. During the grinding, an aqueous ammonia solution was added to maintain the pH at 9.2.

Next, the resulting dispersion including the burned and ground body was treated at 675G for 3 minutes by a centrifuge (type CR21G manufactured by Hitachi Koki Co., Ltd.) and light liquid (supernatant obtained by removing precipitated components) was collected to obtain a silica-based composite fine particle dispersion. The average particle size (median diameter) in the silica-based composite fine particle dispersion, as measured by laser diffraction scattering (LA-950 manufactured by HORIBA, Ltd.), was 0.221 μm (221 nm).

Comparative Example 5

Next, 3 mass % acetic acid was added to the precursor particle dispersion A obtained in the preparation step 2 to adjust the pH to 6.5 and the mixture was dried in a dryer at 120° C. for 15 hours. After that, burning was performed for 2 hours using a muffle furnace at 390° C. to obtain a powdery burned body.

To the resulting burned body (100 g) was added ion exchanged water (300 g) and 3% aqueous ammonia solution was further used to adjust the pH to 9.2. After that, wet grinding (batch desktop sand mill manufactured by Kanpe Hapio Co., Ltd.) was performed for 120 minutes using quartz beads (diameter: 0.25 mm; manufactured by Daiken Chemical Co., Ltd.). The grinding was followed by separation of the beads through a 44 mesh wire. The resulting dispersion including a burned and ground body had a solids concentration of 7.2 mass % and a recovery weight of 1,167 g. During the grinding, an aqueous ammonia solution was added to maintain the pH at 9.2.

Next, the resulting dispersion including the burned and ground body was treated at 675G for 3 minutes by a centrifuge (type CR21G manufactured by Hitachi Koki Co., Ltd.) and light liquid (supernatant obtained by removing precipitated components) was collected to obtain a silica-based composite fine particle dispersion. The average particle size (median diameter) in the silica-based composite fine particle dispersion, as measured by laser diffraction scattering (LA-950 manufactured by HORIBA, Ltd.), was 0.194 μm (194 nm).

Comparative Example 6

3 mass % acetic acid was added to the precursor particles A obtained in the preparation step 2 to adjust the pH to 6.5 and the mixture was dried in a dryer at 120° C. for 15 hours. After that, burning was performed for 2 hours using a muffle furnace at 1,250° C. to obtain a powdery burned body.

To the resulting burned body (310 g) was added ion exchanged water (430 g) and 3.0 mass % ammonia water was further added to adjust the pH to 11.0. After that, the mixture was exposed to ultrasonic irradiation with stirring for 10 minutes in an ultrasonic bath to obtain a suspension. Next, quartz beads (595 g) having a diameter of 0.25 mm were introduced into a grinder (LMZ06 manufactured by Ashizawa Finetech Ltd.) that had previously been subjected to equipment cleaning, thereby performing a water operation. The above-described suspension was further charged into a charge tank of the grinder (filling factor: 85%). The concentration during the grinding is 25 mass % in consideration of the ion exchanged water remaining in the grinding chamber and piping of the grinder. Then, wet grinding was performed under conditions of a disk circumferential velocity in the grinder of 14 m/s, and a number of passes of 30. For each path, 3% aqueous ammonia solution was added so as to maintain the suspension during the grinding at a pH of 11. A dispersion including a burned and ground body and having a solids concentration of 20 mass % was thus obtained.

Next, the resulting dispersion including the burned and ground body was centrifuged at a relative centrifugal acceleration of 675G for 3 minutes by a centrifuge (CR21G manufactured by Hitachi Koki Co., Ltd.) and precipitated components were removed to obtain a silica-based composite fine particle dispersion.

TABLE 1

| | Particles to be measured | | Unit | Example 1 | Example 2 | Example 3 | Example 4 | Example 5 | Example 6 | Example 7 | Comparative Example 1 |
|---|---|---|---|---|---|---|---|---|---|---|---|
| Silica-based fine particles (mother particles) | Average particle size of silica-based fine particles (mother particles) | | nm | 96 | 96 | 96 | 96 | 96 | 70 | 96 | 96 |
| | Impurity contents in silica-based fine particles (mother particles) (with respect to dry weight of silica) | Na | ppm | 42 | 42 | 42 | 42 | 42 | 15 | 42 | 42 |
| | | Ag | ppm | 1 or less | 1 or less | 1 or less | 1 or less | 1 or less | 1 or less | 1 or less | 1 or less |
| | | Al | ppm | 83 | 83 | 83 | 83 | 83 | 98 | 83 | 83 |
| | | Ca | ppm | 17 | 17 | 17 | 17 | 17 | 17 | 17 | 17 |
| | | Cr | ppm | 1 or less | 1 or less | 1 or less | 1 or less | 1 or less | 1 or less | 1 or less | 1 or less |
| | | Cu | ppm | 1 or less | 1 or less | 1 or less | 1 or less | 1 or less | 1 or less | 1 or less | 1 or less |
| | | Fe | ppm | 17 | 17 | 17 | 17 | 17 | 15 | 17 | 17 |
| | | K | ppm | 1 or less | 1 or less | 1 or less | 1 or less | 1 or less | 1 or less | 1 or less | 1 or less |
| | | Mg | ppm | 1 or less | 1 or less | 1 or less | 1 or less | 1 or less | 1 or less | 1 or less | 1 or less |
| | | Ni | ppm | 1 or less | 1 or less | 1 or less | 1 or less | 1 or less | 1 or less | 1 or less | 1 or less |
| | | Ti | ppm | 75 | 75 | 75 | 75 | 75 | 80 | 75 | 75 |
| | | Zn | ppm | 1 or less | 1 or less | 1 or less | 1 or less | 1 or less | 1 or less | 1 or less | 1 or less |
| | | Zr | ppm | 1 or less | 1 or less | 1 or less | 1 or less | 1 or less | 1 or less | 1 or less | 1 or less |
| | | U | ppm | 1 or less | 1 or less | 1 or less | 1 or less | 1 or less | 1 or less | 1 or less | 1 or less |
| | | Th | ppm | 1 or less | 1 or less | 1 or less | 1 or less | 1 or less | 1 or less | 1 or less | 1 or less |
| | | $SO_4$ | ppm | 1 or less | 1 or less | 1 or less | 1 or less | 1 or less | 1 or less | 1 or less | 1 or less |
| | | $NO_3$ | ppm | 1 or less | 1 or less | 1 or less | 1 or less | 1 or less | 1 or less | 1 or less | 1 or less |
| | | Cl | ppm | 1 or less | 1 or less | 1 or less | 1 or less | 1 or less | 1 or less | 1 or less | 1 or less |
| | | F | ppm | 1 or less | 1 or less | 1 or less | 1 or less | 1 or less | 1 or less | 1 or less | 1 or less |

TABLE 1-continued

| | Particles to be measured | | Unit | Comparative Example 2 | Comparative Example 3 | Comparative Example 4 | Comparative Example 5 | Comparative Example 6 |
|---|---|---|---|---|---|---|---|---|
| Silica-based fine particles (mother particles) | Average particle size of silica-based fine particles (mother particles) | | nm | 96 | — | 96 | 96 | 96 |
| | Impurity contents in silica-based fine particles (mother particles) (with respect to dry weight of silica) | Na | ppm | 42 | — | 42 | 42 | 42 |
| | | Ag | ppm | 1 or less | — | 1 or less | 1 or less | 1 or less |
| | | Al | ppm | 83 | — | 83 | 83 | 83 |
| | | Ca | ppm | 17 | — | 17 | 17 | 17 |
| | | Cr | ppm | 1 or less | — | 1 or less | 1 or less | 1 or less |
| | | Cu | ppm | 1 or less | — | 1 or less | 1 or less | 1 or less |
| | | Fe | ppm | 17 | — | 17 | 17 | 17 |
| | | K | ppm | 1 or less | — | 1 or less | 1 or less | 1 or less |
| | | Mg | ppm | 1 or less | — | 1 or less | 1 or less | 1 or less |
| | | Ni | ppm | 1 or less | — | 1 or less | 1 or less | 1 or less |
| | | Ti | ppm | 75 | — | 75 | 75 | 75 |
| | | Zn | ppm | 1 or less | — | 1 or less | 1 or less | 1 or less |
| | | Zr | ppm | 1 or less | — | 1 or less | 1 or less | 1 or less |
| | | U | ppm | 1 or less | — | 1 or less | 1 or less | 1 or less |
| | | Th | ppm | 1 or less | — | 1 or less | 1 or less | 1 or less |
| | | $SO_4$ | ppm | 1 or less | — | 1 or less | 1 or less | 1 or less |
| | | $NO_3$ | ppm | 1 or less | — | 1 or less | 1 or less | 1 or less |
| | | Cl | ppm | 1 or less | — | 1 or less | 1 or less | 1 or less |
| | | F | ppm | 1 or less | — | 1 or less | 1 or less | 1 or less |

TABLE 2

| | Particles to be measured | | Unit | Example 1 | Example 2 | Example 3 | Example 4 | Example 5 | Example 6 | Example 7 | Comparative Example 1 |
|---|---|---|---|---|---|---|---|---|---|---|---|
| Silica-based composite fine particles | Impurity contents in silica-based composite fine particles (with respect to dry weight of silica) | Na | ppm | 18 | 19 | 18 | 22 | 19 | 7 | 13 | 42 |
| | | Ag | ppm | 1 or less | 1 or less | 1 or less | 1 or less | 1 or less | 1 or less | 1 or less | 1 or less |
| | | Al | ppm | 38 | 38 | 39 | 44 | 38 | 45 | 25 | 83 |
| | | Ca | ppm | 7 | 8 | 8 | 9 | 8 | 7 | 2 | 17 |
| | | Cr | ppm | 1 or less | 1 or less | 1 or less | 1 or less | 1 or less | 1 or less | 1 or less | 1 or less |
| | | Cu | ppm | 1 or less | 1 or less | 1 or less | 1 or less | 1 or less | 1 or less | 1 or less | 1 or less |
| | | Fe | ppm | 8 | 8 | 8 | 9 | 8 | 7 | 5 | 17 |
| | | K | ppm | 1 or less | 1 or less | 1 or less | 1 or less | 1 or less | 1 or less | 1 or less | 1 or less |
| | | Mg | ppm | 1 or less | 1 or less | 1 or less | 1 or less | 1 or less | 1 or less | 1 or less | 1 or less |
| | | Ni | ppm | 1 or less | 1 or less | 1 or less | 1 or less | 1 or less | 1 or less | 1 or less | 1 or less |
| | | Ti | ppm | 35 | 34 | 35 | 41 | 35 | 41 | 23 | 75 |
| | | Zn | ppm | 1 or less | 1 or less | 1 or less | 1 or less | 1 or less | 1 or less | 1 or less | 1 or less |
| | | Zr | ppm | 1 or less | 1 or less | 1 or less | 1 or less | 1 or less | 1 or less | 1 or less | 1 or less |
| | | U | ppm | 1 or less | 1 or less | 1 or less | 1 or less | 1 or less | 1 or less | 1 or less | 1 or less |
| | | Th | ppm | 1 or less | 1 or less | 1 or less | 1 or less | 1 or less | 1 or less | 1 or less | 1 or less |
| | | $SO_4$ | ppm | 1 or less | 1 or less | 1 or less | 1 or less | 1 or less | 1 or less | 1 or less | 1 or less |
| | | $NO_3$ | ppm | 1 or less | 1 or less | 1 or less | 1 or less | 1 or less | 1 or less | 1 or less | 1 or less |
| | | Cl | ppm | 1 or less | 1 or less | 1 or less | 1 or less | 1 or less | 1 or less | 1 or less | 1 or less |
| | | F | ppm | 1 or less | 1 or less | 1 or less | 1 or less | 1 or less | 1 or less | 1 or less | 1 or less |

| | Particles to be measured | | Unit | Comparative Example 2 | Comparative Example 3 | Comparative Example 4 | Comparative Example 5 | Comparative Example 6 |
|---|---|---|---|---|---|---|---|---|
| Silica-based composite fine particles | Impurity contents in silica-based composite fine particles (with respect to dry weight of silica) | Na | ppm | 19 | 1 or less | 18 | 18 | 19 |
| | | Ag | ppm | 1 or less | 1 or less | 1 or less | 1 or less | 1 or less |
| | | Al | ppm | 38 | 1 or less | 38 | 38 | 38 |
| | | Ca | ppm | 8 | 1 or less | 7 | 7 | 8 |
| | | Cr | ppm | 1 or less | 1 or less | 1 or less | 1 or less | 1 or less |
| | | Cu | ppm | 1 or less | 1 or less | 1 or less | 1 or less | 1 or less |
| | | Fe | ppm | 8 | 1 or less | 8 | 8 | 8 |
| | | K | ppm | 1 or less | 1 or less | 1 or less | 1 or less | 1 or less |
| | | Mg | ppm | 1 or less | 1 or less | 1 or less | 1 or less | 1 or less |
| | | Ni | ppm | 1 or less | 1 or less | 1 or less | 1 or less | 1 or less |
| | | Ti | ppm | 35 | 1 or less | 35 | 35 | 35 |
| | | Zn | ppm | 1 or less | 1 or less | 1 or less | 1 or less | 1 or less |
| | | Zr | ppm | 1 or less | 1 or less | 1 or less | 1 or less | 1 or less |
| | | U | ppm | 1 or less | 1 or less | 1 or less | 1 or less | 1 or less |
| | | Th | ppm | 1 or less | 1 or less | 1 or less | 1 or less | 1 or less |
| | | $SO_4$ | ppm | 1 or less | 1 or less | 1 or less | 1 or less | 1 or less |
| | | $NO_3$ | ppm | 1 or less | 1 or less | 1 or less | 1 or less | 1 or less |
| | | Cl | ppm | 1 or less | 1 or less | 1 or less | 1 or less | 1 or less |
| | | F | ppm | 1 or less | 1 or less | 1 or less | 1 or less | 1 or less |

TABLE 3

| Particles to be measured | | Unit | Example 1 | Example 2 | Example 3 | Example 4 | Example 5 | Example 6 | Example 7 |
|---|---|---|---|---|---|---|---|---|---|
| Silica-based composite fine particles | Ratio of parts by mass of ceria to 100 parts by mass of silica | Parts by mass | 117.4 | 117.4 | 117.4 | 117.4 | 117.4 | 117.4 | 233.3 |
| | Burning temperature | °C. | 1062 | 1062 | 1062 | 1030 | 1062 | 1064 | 1028 |
| | Relative centrifugal acceleration | G | 1700 | 10000 | 1700 | 1700 | 675 | 1700 | 675 |
| | Crystallite size | nm | 15 | 15 | 15 | 15 | 15 | 15 | 20 |
| | Average particle size of child particles | nm | 18 | 18 | 18 | 17 | 18 | 17 | 21 |
| | Crystal type | — | Cerianite | Cerianite | Cerianite | Cerianite | Cerianite | Cerianite | Cerianite |
| | Specific surface area | $m^2/g$ | 47 | 31 | 35 | 33 | 26 | 38 | 23 |
| | Average particle size of silica-based composite fine particles | μm | 0.196 | 0.200 | 0.198 | 0.194 | 0.208 | 0.158 | 0.201 |
| | Percentage of number of particles having a ratio between shorter diameter and longer diameter of not more than 0.8 | % | 32 | 33 | 34 | 30 | 35 | 33 | 34 |
| Polishing evaluation | Polishing performance of thermally oxidized film ($SiO_2$ film) | Polishing rate | nm/min | 373 | 377 | 666 | 495 | 425 | 688 | 653 |
| | | Surface roughness Ro | nm | 0.09 | 0.09 | 0.09 | 0.08 | 0.11 | 0.10 | 0.10 |
| | | Linear scratches | — | Not seen definitely | Not seen definitely | Not seen definitely | Not seen definitely | Not seen definitely | Not seen definitely | Not seen definitely |
| | Polishing performance of aluminum hard disk | Linear scratches | — | Few | Few | Few | Few | Few | Few | Few |

| Particles to be measured | | | Comparative Example 1 | Comparative Example 2 | Comparative Example 3 | Comparative Example 4 | Comparative Example 5 | Comparative Example 6 |
|---|---|---|---|---|---|---|---|---|
| Silica-based composite fine particles | Ratio of parts by mass of ceria to 100 parts by mass of silica | | 0 | 117.4 | — | 117.4 | 117.4 | 117.4 |
| | Burning temperature | | — | — | — | 1250 | 390 | 1250 |
| | Relative centrifugal acceleration | | — | — | — | 675 | 675 | 675 |
| | Crystallite size | | — | 2 | 18 | 38 | 3 | 38 |
| | Average particle size of child particles | | — | 2 | — | 40 | 3 | 40 |
| | Crystal type | | Amorphous | Cerianite | Cerianite | Cerianite | Cerianite | Cerianite |
| | Specific surface area | | 40 | 61 | 47 | 32 | 58 | 32 |
| | Average particle size of silica-based composite fine particles | | 0.109 | 4.6 | 0.116 | 0.221 | 0.194 | 0.218 |
| | Percentage of number of particles having a ratio between shorter diameter and longer diameter of not more than 0.8 | | 0 | 100 | 100 | 100 | 28 | 85 |
| Polishing evaluation | Polishing performance of thermally oxidized film ($SiO_2$ film) | Polishing rate | 45 | 20 | 25 | 669 | 22 | 645 |
| | | Surface roughness Ro | 0.12 | 0.3 | 0.14 | Correct measurement cannot be made due to a lot of scratches | Correct measurement cannot be made due to a lot of remaining particles | Correct measurement cannot be made due to a lot of scratches |
| | | Linear scratches | Not seen definitely | Present | Present | Innumerable | Not seen definitely | Innumerable |
| | Polishing performance of aluminum hard disk | Linear scratches | Few | Many | A few | Too many to be counted | Few | Too many to be counted |

\<Experiment 2\> EDS Composition Analysis of Coating

The silica-based composite fine particles included in the silica-based composite fine particle dispersion obtained in Example 4 was observed with a transmission electron microscope (field-emission transmission electron microscope JEM-2100F (including Cs correction) manufactured by JEOL Ltd.; accelerated electron: 120 kV; magnification: 50,000×) to see that a coating is present outside the child particles (ceria crystal particles), and then EDS measurement including selectively applying electron beams to the coating portion was performed.

Measurement conditions of the energy dispersive X-ray spectrometry (EDS) are shown below.

The silica-based composite fine particles were dispersed in pure water and the dispersion was then placed on a carbon support film-attached Cu mesh and measurement was performed using a measuring device shown below.

Measuring device: UTW type Si (Li) semiconductor detector manufactured by JEOL Ltd.

Beam system: 0.2 nm

Figure 5:
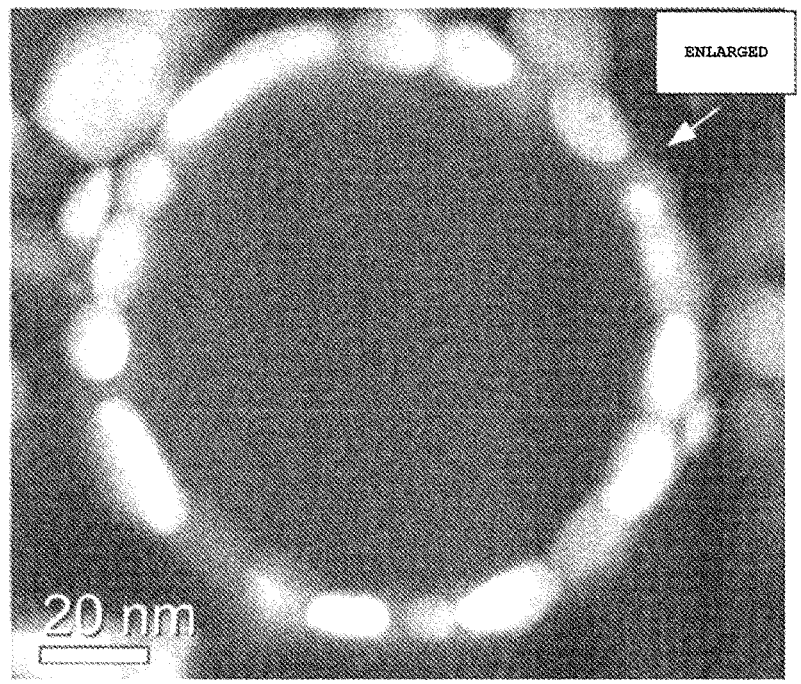
FIG. 5(a) is a TEM obtained in Example 4.
FIG. 5(b) is a partially enlarged TEM image of FIG. 5(a).
Figure 5:
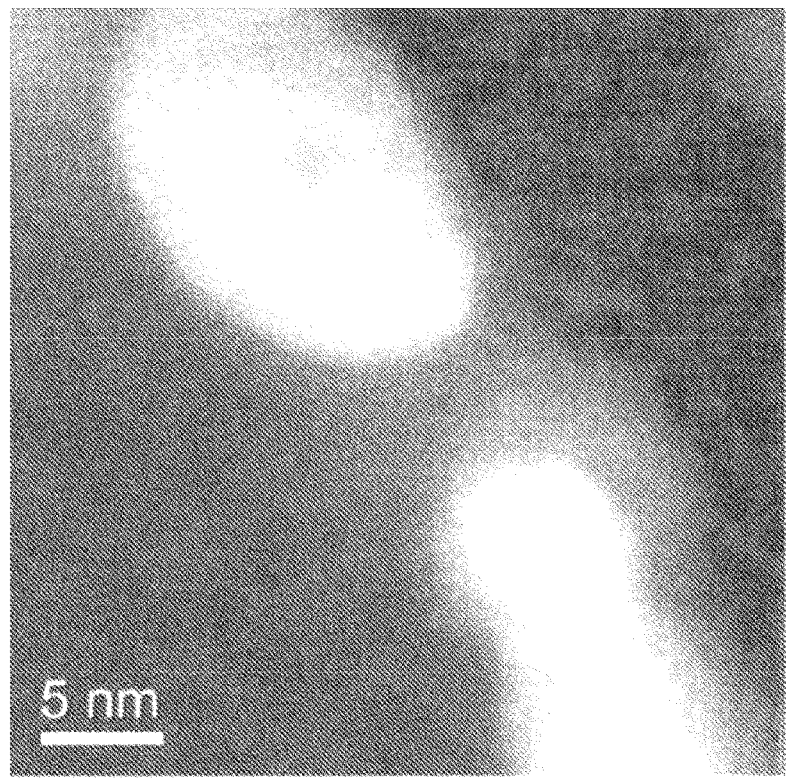
Figure 6:
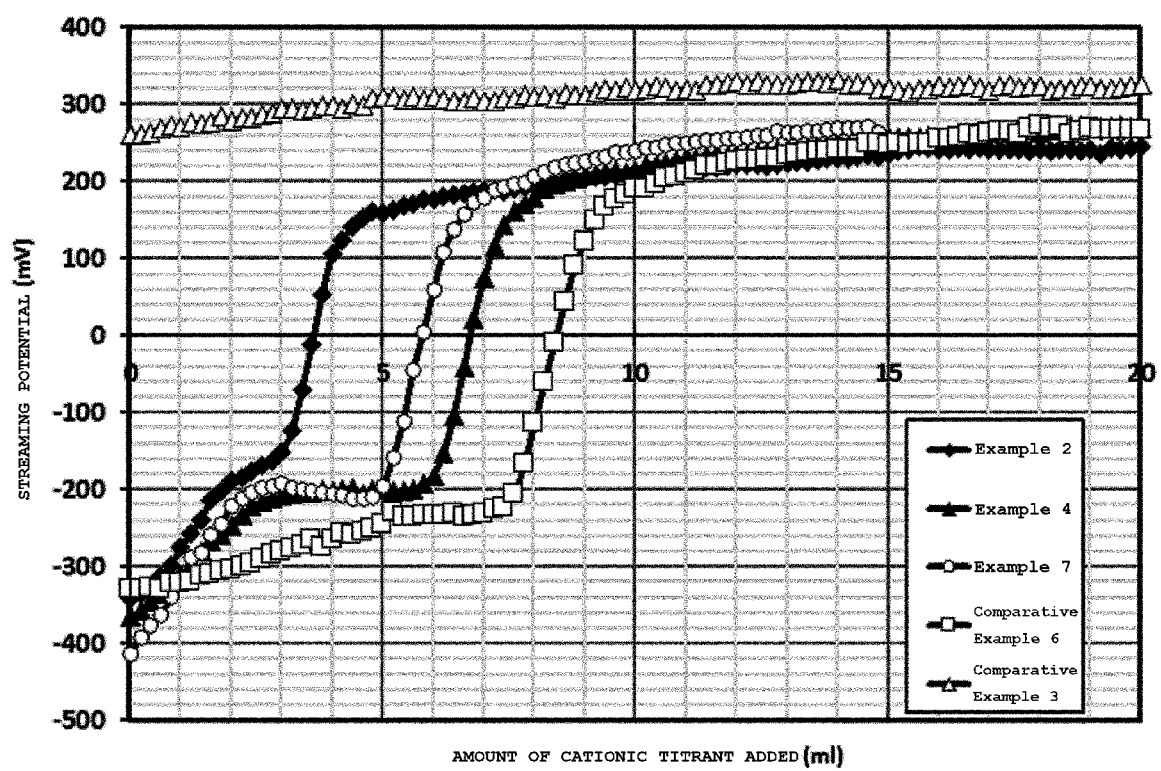
FIG. 6 is a titration graph of streaming potential.

Photographs (TEM images) obtained through observation using a transmission electron microscope are shown in FIGS. 5(*a*) and 5(*b*). Then, as a result of the EDS measurement in which electron beams were selectively applied to the silica coating portion outside the child particles (ceria crystal particles) that had been seen in FIGS. 5(*a*) and 5(*b*), an Si intensity peak appeared near 1.74 keV and a Ce intensity peak appeared near 4.84 keV. The percentage of the number of Si atoms was 0.836 atom % and the percentage of the number of Ce atoms was 0.277, and the ratio of the percentage of the number of Si atoms to the percentage of the number of Ce atoms was calculated to be 3.018. Results of the measurement that was also performed in the same manner about Examples 1 and 7, and Comparative Examples 1 and 3 are shown in Table 4. No coating was seen in Comparative Examples 1 and 3.

TABLE 4

|  | Example 1 | Example 4 | Example 7 | Comparative Example 1 | Comparative Example 3 |
|---|---|---|---|---|---|
| Coating | Present | Present | Present | Not seen | Not seen |
| Si atom % | 3.120 | 0.836 | 0.213 | — | — |
| Ce atom % | 0.557 | 0.277 | 0.058 | — | — |
| Si atom %/ Ce atom % | 5.599 | 3.018 | 3.682 | — | — |

<Experiment 3>

The silica-based composite fine particle dispersion obtained in each of Examples 2, 4, and 7 and Comparative Examples 3 and 6 was subjected to streaming potential measurement and cation colloidal titration. An automatic titrator AT-510 (manufactured by Kyoto Electronics Manufacturing Co., Ltd.) equipped with a streaming potential titration unit (PCD-500) was used as a titrator.

Figure 4:
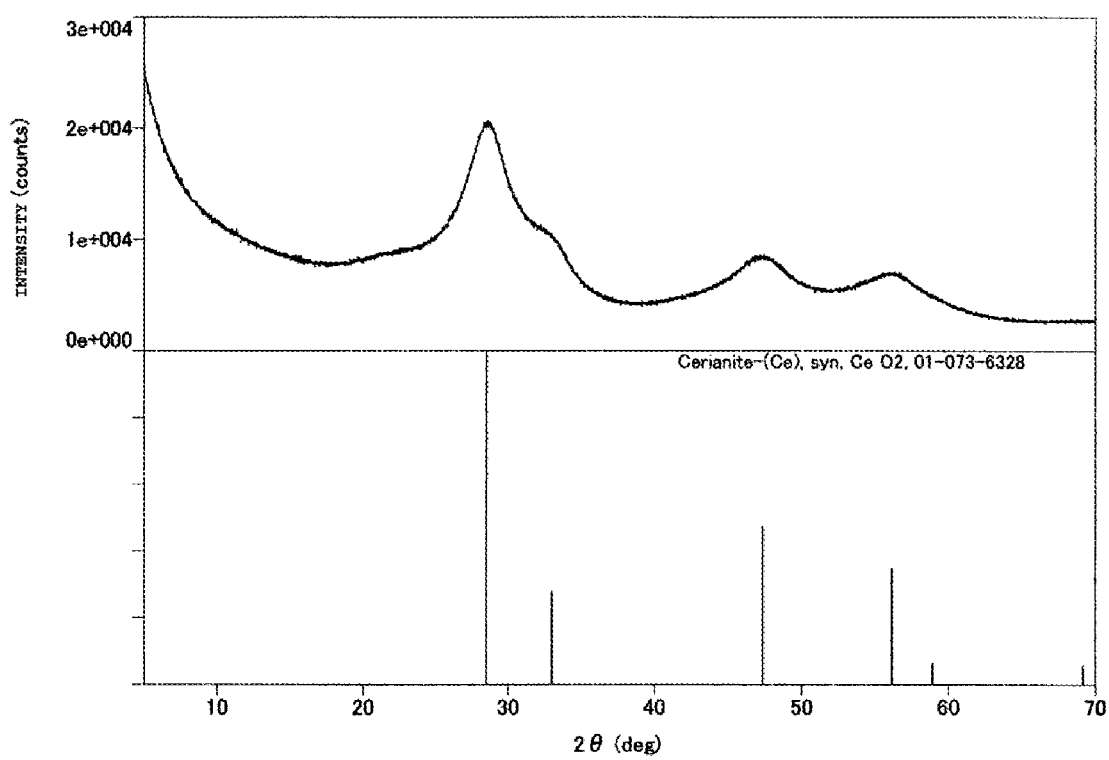
FIG. 4 is an X-ray diffraction pattern obtained in Comparative Example 2.

First, a 0.05% aqueous hydrochloric acid solution was added to the silica-based composite fine particle dispersion having a solids concentration adjusted to 1 mass % to thereby adjust the pH to 6. Then, a portion of the dispersion containing 0.8 g of solids was placed in a 100-mL tall beaker and subjected to streaming potential measurement. Next, titration was performed by adding a cation colloidal titrant (20 mL; 0.001 N polydiallyl dimethyl ammonium chloride solution) at intervals of 5 seconds in an amount of 0.2 mL per injection and at an injection rate of 2 s/mL. Then, the amount (mL) of cation colloidal titrant added was plotted on the x-axis, and the streaming potential (mV) of the silica-based composite fine particle dispersion was plotted on the y-axis. The streaming potential I (mV) at the starting point of the streaming potential curve, the streaming potential C (mV) at the knick, and the amount V (mL) of cation colloidal titrant added were determined to calculate $\Delta PCD/V=(I-C)/V$. The results are shown in Table 5. A streaming potential curve is shown in FIG. 4.

TABLE 5

|  | Example 2 | Example 4 | Example 7 | Comparative Example 3 | Comparative Example 6 |
|---|---|---|---|---|---|
| Streaming potential | −341 | −365 | −413 | 261 | −328 |

TABLE 5-continued

|  | Example 2 | Example 4 | Example 7 | Comparative Example 3 | Comparative Example 6 |
|---|---|---|---|---|---|
| before titration @pH 6(mV) |  |  |  |  |  |
| ΔPCD/V (mV/mL) | −64 | −31 | −42 | No inflection point | −14 |

<Experiment 4>
[Measurement of State of Si Solid Solution]

The silica-based composite fine particle dispersion prepared in Example 5 was subjected to measurement of X-ray absorption spectra at CeL III absorption edge (5,727 eV) using an X-ray absorption spectrometer (R-XAS Looper manufactured by Rigaku Corporation) to obtain EXAFS vibrations appearing on the X-ray absorption spectra. Software REX-2000 manufactured by Rigaku Corporation was used for analysis and the average coordination numbers N of atoms of oxygen and cerium on the periphery of cerium and the average bond lengths R were obtained. The results are shown in Table 6.

It was confirmed from the results in Table 6 that oxygen, silicon, and cerium are present on the periphery of cerium, the interatomic distance between cerium and oxygen is 2.4 Å, and the interatomic distance between cerium and cerium is 3.8 Å, whereas the interatomic distance between cerium and silicon is 3.2 Å. It is deemed from the XRD analysis results that since cerium is present as $CeO_2$ in the crystal type of Cerianite, Si enters into solid solution in cerium oxide.

Measurement was also performed in the same manner about Examples 1 and 4, and Comparative Examples 3 and 4. The results are shown in Table 6.

TABLE 6

|  | Unit | Element | Example 1 | Example 4 | Example 5 | Comparative Example 3 | Comparative Example 4 |
|---|---|---|---|---|---|---|---|
| Coordination number (N) at the center of Ce | — | Ce | 8.0 | 7.9 | 7.9 | 8.0 | 8.0 |
|  |  | Si | 1.1 | 1.3 | 1.1 | Not more than detection limit | Not more than detection limit |
| Distance (R) from Ce | Å | O | 2.4 | 2.5 | 2.4 | 2.3 | 2.4 |
|  |  | Ce | 3.8 | 3.9 | 3.8 | 3.7 | 3.7 |
|  |  | Si | 3.2 | 3.2 | 3.2 | — | — |

INDUSTRIAL APPLICABILITY

The composite fine particles of the invention do not contain impurities and can be therefore preferably used to polish surfaces of semiconductor devices such as semiconductor substrates and circuit boards.

The invention claimed is:

1. A silica-based composite fine particle dispersion, child particles primarily composed of crystalline ceria being formed on surfaces of mother particles primarily composed of amorphous silica, the silica-based composite fine particle dispersion comprising silica-based composite fine particles having an average particle size of 50 to 350 nm and having characteristic features of [1] to [5]:
   [1] the silica-based composite fine particles have a mass ratio between silica and ceria of 100:11 to 316;
   [2] only a ceria crystal phase is detected when the silica-based composite fine particles are subjected to X-ray diffractometry;
   [3] a crystallite size in the crystalline ceria, as measured by subjecting the silica-based composite fine particles to X-ray diffractometry, is 10 to 25 nm;

[4] each of the silica-based composite fine particles has a silica coating formed partly on surfaces of the child particles; and
[5] a ratio of a percentage of a number of Si atoms to a percentage of a number of Ce atoms (Si atom %/Ce atom %) as measured by EDS measurement is not less than 0.9, the EDS measurement being performed by selectively applying electron beams to a portion of the silica coating of the silica-based composite fine particles that can be observed using a transmission electron microscope, wherein when cation colloidal titration is performed, a streaming potential curve in which a ratio ($\Delta PCD/V$) between an amount of streaming potential change ($\Delta PCD$) and an amount of cation colloidal titrant added at a knick (V) as expressed by formula (1) is in a range of −110.0 to −15.0 is obtained:

$$\Delta PCD/V = (I-C)/V \qquad \text{formula (1)}$$

C: streaming potential (mV) at the knick
I: streaming potential (mV) at a starting point of the streaming potential curve; and
V: amount of the cation colloidal titrant added at the knick (mL).

2. The silica-based composite fine particle dispersion according to claim 1 having a characteristic feature of [6]:
[6] in the silica-based composite fine particles, a percentage of a number of particles having a ratio between a shorter diameter and a longer diameter, as measured by an image analysis method, of not more than 0.8 is not more than 35%.

3. The silica-based composite fine particle dispersion according to claim 1 having a characteristic feature of [7]:
silicon [7] silicon atoms enter into solid solution in the crystalline ceria as a main component of the child particles.

4. The silica-based composite fine particle dispersion according to claim 3, wherein as for cerium atoms and silicon atoms included in the child particles, a relationship of $R_1 < R_2$, where $R_1$ is a distance between adjacent cerium and silicon atoms, and $R_2$ is a distance between adjacent cerium atoms, is satisfied.

5. The silica-based composite fine particle dispersion according to claim 1, wherein impurities are contained in the silica-based composite fine particles in amounts shown in (a) and (b):
(a) Na, Ag, Al, Ca, Cr, Cu, Fe, K, Mg, Ni, Ti, Zn, and Zr are contained in amounts of not more than 100 ppm, respectively; and
(b) U, Th, Cl, $NO_3$, $SO_4$, and F are contained in amounts of not more than 5 ppm, respectively.

6. The silica-based composite fine particle dispersion according to claim 1, wherein a streaming potential before titration is a negative potential at a pH value ranging from 3 to 8.

7. A polishing abrasive grain dispersion comprising the silica-based composite fine particle dispersion according to claim 1.

8. The polishing abrasive grain dispersion according to claim 7, wherein the polishing abrasive grain dispersion is used for flattening a semiconductor substrate having a silica film formed thereon.

9. A polishing abrasive grain dispersion comprising the silica-based composite fine particles according to claim 1 and having an ionic strength of not less than 0.007.

10. A polishing abrasive grain dispersion according to claim 9 comprising one or two ionic strength adjusters selected from the group consisting of ammonium nitrate and ammonium acetate.

11. The polishing abrasive grain dispersion according to claim 9, wherein the polishing abrasive grain dispersion is used for flattening a semiconductor substrate having a silica film formed thereon.

12. The polishing abrasive grain dispersion according to claim 9, wherein the polishing abrasive grain dispersion has a pH of 3 to 8, and is used for flattening a semiconductor substrate having a silica film formed thereon.

13. The polishing abrasive grain dispersion comprising the silica-based composite fine particles according to claim 1 and further comprising an acidic compound having an acid dissociation constant (pKa) of not less than 1.5.

14. The polishing abrasive grain dispersion according to claim 13, wherein the acidic compound is contained in an amount of 0.0002 to 0.1 mass %.

15. The polishing abrasive grain dispersion according to claim 13, wherein the acidic compound is acetic acid.

16. The polishing abrasive grain dispersion according to claim 13, wherein the polishing abrasive grain dispersion is used for flattening a semiconductor substrate having a silica film formed thereon.

17. The polishing abrasive grain dispersion according to claim 13, wherein the polishing abrasive grain dispersion has a pH of 3 to 8, and is used for flattening a semiconductor substrate having a silica film formed thereon.

* * * * *

UNITED STATES PATENT AND TRADEMARK OFFICE
CERTIFICATE OF CORRECTION

| | | |
|---|---|---|
| PATENT NO. | : 10,844,259 B2 | Page 1 of 1 |
| APPLICATION NO. | : 16/094969 | |
| DATED | : November 24, 2020 | |
| INVENTOR(S) | : Yuji Tawarazako et al. | |

It is certified that error appears in the above-identified patent and that said Letters Patent is hereby corrected as shown below:

In the Specification

Column 1, Line 4, Above "TECHNICAL FIELD"
insert -- CROSS-REFERENCE TO RELATED APPLICATIONS
This application is the United States national phase of International Application No. PCT/JP2017/014187 filed Apr. 5, 2017, and claims priority to Japanese Patent Application Nos. 2016-086610, 2016-086612, 2016-086613, and 2016-086614, all filed Apr. 22, 2016, the disclosures of which are hereby incorporated in their entireties by reference. --

In the Claims

Column 47, Line 34, Claim 3, before "[7]" delete "silicon"

Signed and Sealed this
Fourth Day of May, 2021

Drew Hirshfeld
*Performing the Functions and Duties of the*
*Under Secretary of Commerce for Intellectual Property and*
*Director of the United States Patent and Trademark Office*